(12) United States Patent
Shental et al.

(10) Patent No.: US 11,722,189 B2
(45) Date of Patent: Aug. 8, 2023

(54) FRONTHAUL COMPRESSION FOR SPARSE ACCESS AND DENSE ACCESS

(71) Applicant: QUALCOMM Incorporated, San Diego, CA (US)

(72) Inventors: Ori Shental, Marlboro, NJ (US); Ashwin Sampath, Skillman, NJ (US); Ozge Koymen, Princeton, NJ (US); Junyi Li, Fairless Hills, PA (US); Juergen Cezanne, Ocean Township, NJ (US); Qiang Wu, San Diego, CA (US); Meilong Jiang, Westfield, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/645,005

(22) Filed: Dec. 17, 2021

(65) Prior Publication Data

US 2023/0198585 A1  Jun. 22, 2023

(51) Int. Cl.
*H04L 69/04* (2022.01)
*H04L 5/00* (2006.01)
(Continued)

(52) U.S. Cl.
CPC ......... *H04B 7/0482* (2013.01); *H04B 7/0478* (2013.01); *H04L 5/0048* (2013.01); *H04W 28/06* (2013.01); *H04W 72/23* (2023.01)

(58) Field of Classification Search
CPC ...... H04N 19/176; H04N 19/61; H04N 19/60; H04N 19/172; H04N 19/126;
(Continued)

(56) References Cited

U.S. PATENT DOCUMENTS 6,127,953 A * 10/2000 Manzardo ............... H03M 7/30
  341/87
2013/0083855 A1* 4/2013 Kottke ................... H04N 19/85
  375/240.03
(Continued)

FOREIGN PATENT DOCUMENTS

WO  2013084058 A1  6/2013
WO  WO-2021187848 A1 *  9/2021

OTHER PUBLICATIONS

International Search Report and Written Opinion—PCT/US2022/050497—ISA/EPO—dated Feb. 27, 2023.

*Primary Examiner* — Eva Y Puente
(74) *Attorney, Agent, or Firm* — Qualcomm Incorporated/Procopio, Cory, Hargreaves & Savitch

(57) ABSTRACT

Methods, apparatuses, and computer-readable medium for fronthaul compression are provided. An example method may include receiving, from a UE, uplink data via one or more active tones of a plurality of tones in a symbol, the uplink data corresponding to an access vector. The example method may further include compressing the uplink data based on a linear transformation of a pseudo-access vector generated based on the access vector, the linear transformation including a matrix, the compression enabling a second network entity to decompress the compressed uplink data without knowing one or more locations associated with the one or more active tones. The example method may further include transmitting, to the second network entity, the compressed uplink data.

30 Claims, 14 Drawing Sheets

(51) Int. Cl.
*H04B 7/0456* (2017.01)
*H04W 28/06* (2009.01)
*H04W 72/23* (2023.01)

(58) Field of Classification Search
CPC .... H04N 19/186; H04N 19/124; H04N 19/14;
H04L 69/04; H04L 69/22; H04L 63/0428;
H04L 47/34; H04L 67/12; H04L 69/40;
H04L 9/40; H04L 5/0023; H04L 5/0069;
H04L 1/00; H04L 1/0061; H04L 65/40;
H04L 69/324; H04L 67/565; H03M 7/30;
H03M 13/6525; H03M 7/40; H03M 7/50
USPC ......................................................... 375/262
See application file for complete search history.

(56) References Cited

U.S. PATENT DOCUMENTS

| | | | | |
|---|---|---|---|---|
| 2013/0322336 | A1* | 12/2013 | Cheng | H04W 28/06 370/328 |
| 2016/0142951 | A1* | 5/2016 | Balasubramanian | H04W 36/023 370/331 |
| 2020/0359449 | A1* | 11/2020 | Kim | H04L 67/141 |
| 2020/0366542 | A1 | 11/2020 | Barbieri et al. | |

* cited by examiner

FRONTHAUL COMPRESSION FOR SPARSE ACCESS AND DENSE ACCESS

TECHNICAL FIELD

The present disclosure relates generally to communication systems, and more particularly, to wireless communication systems with radio units (RU) and distributed units (DUs).

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

BRIEF SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus at a first network entity are provided. The apparatus may include a memory and at least one processor coupled to the memory. The memory and the at least one processor coupled to the memory may be configured to receive, from a UE, uplink data via one or more active tones of a plurality of tones in a symbol, the uplink data corresponding to an access vector. The memory and the at least one processor coupled to the memory may be further configured to compress the uplink data based on a linear transformation of a pseudo-access vector generated based on the access vector, the linear transformation including a matrix, the compression enabling a second network entity to decompress the compressed uplink data without knowing one or more locations associated with the one or more active tones. The memory and the at least one processor coupled to the memory may be further configured to transmit, to the second network entity, the compressed uplink data.

In an aspect of the disclosure, a method, a computer-readable medium, and an apparatus at a first network entity are provided. The apparatus may include a memory and at least one processor coupled to the memory. The memory and the at least one processor coupled to the memory may be configured to receive, from a second network entity, compressed downlink data. The memory and the at least one processor coupled to the memory may be further configured to decompress the compressed downlink data based on a minimization of a pseudo-access vector without knowing one or more locations associated with one or more active tones of a plurality of tones in a symbol, the decompressed downlink data corresponding to the one or more active tones of a plurality of tones. The memory and the at least one processor coupled to the memory may be further configured to transmit, to a UE, the decompressed downlink data, the decompressed downlink data corresponding to the pseudo-access vector.

In an aspect of the disclosure, a method, a computer-readable medium, and an apparatus at a second network entity are provided. The apparatus may include a memory and at least one processor coupled to the memory. The memory and the at least one processor coupled to the memory may be configured to receive, from a first network entity, compressed uplink data. The memory and the at least one processor coupled to the memory may be further configured to decompress the compressed uplink data based on a minimization of a pseudo-access vector without knowing one or more locations associated with one or more active tones of a plurality of tones in a symbol, the decompressed uplink data corresponding to the one or more active tones. The memory and the at least one processor coupled to the memory may be further configured to transmit, to at least one other network entity, the decompressed uplink data.

In an aspect of the disclosure, a method, a computer-readable medium, and an apparatus at a second network entity are provided. The apparatus may include a memory and at least one processor coupled to the memory. The memory and the at least one processor coupled to the memory may be configured to receive, from at least one other network entity, downlink data via one or more active tones of a plurality of tones in a symbol, the downlink data corresponding to a vector. The memory and the at least one processor coupled to the memory may be further configured to compress the downlink data based on a linear transformation of a pseudo-access vector generated based on the access vector, the linear transformation including a matrix, the compression enabling a first network entity to decompress the compressed downlink data without knowing one or more locations associated with the one or more active tones. The memory and the at least one processor coupled to the memory may be further configured to transmit, to a first network entity, the compressed downlink data.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
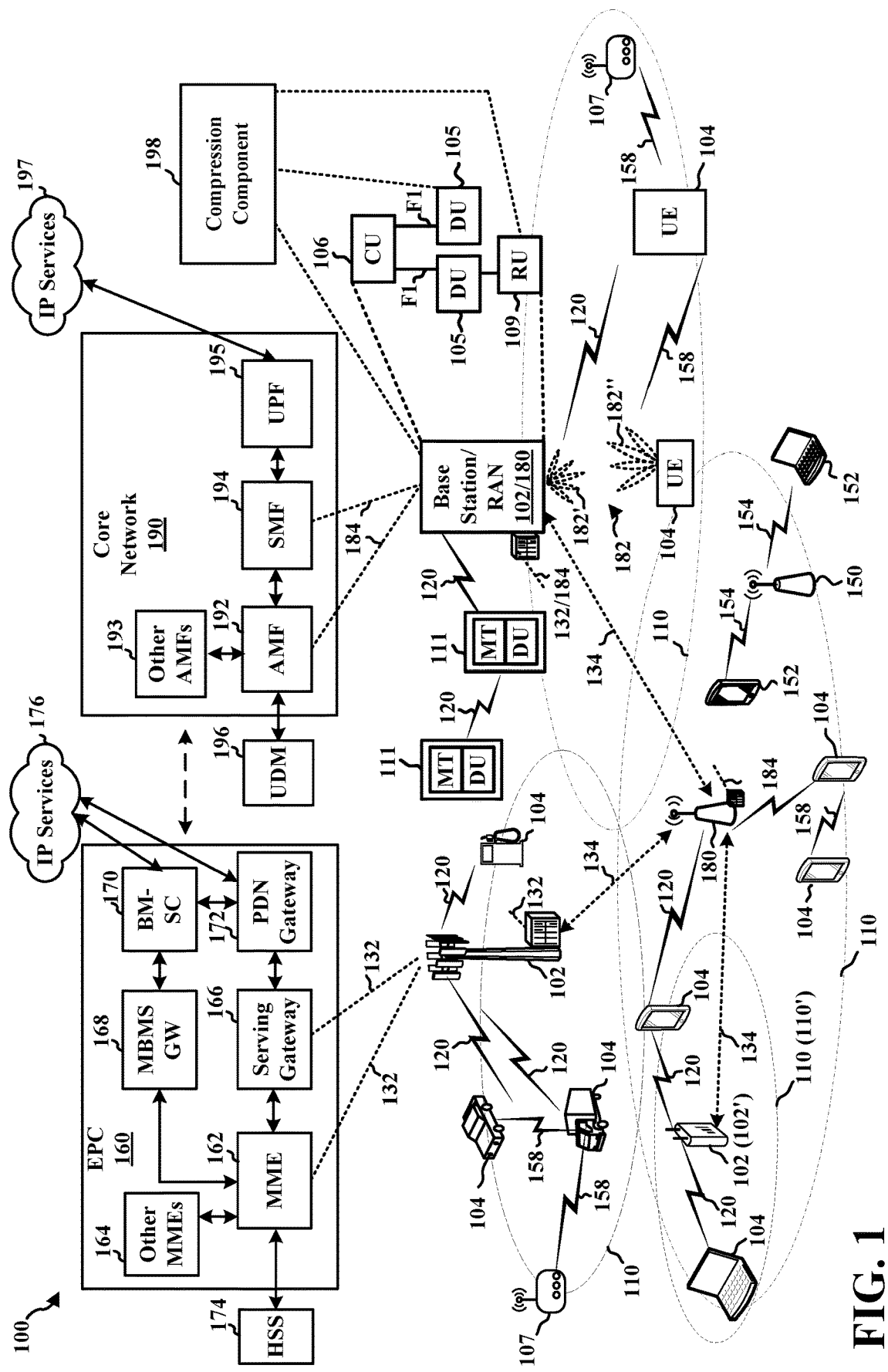
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the types of computer-readable media, or any other medium that can be used to store computer executable code in the form of instructions or data structures that can be accessed by a computer.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, and packaging arrangements. For example, implementations and/or uses may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also include additional components and features for implementation and practice of claimed and described aspect. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, aggregated or disaggregated components, end-user devices, etc. of varying sizes, shapes, and constitution.

FIG. 1 is a diagram illustrating an example of a wireless communications system and an access network 100. The wireless communications system (also referred to as a wireless wide area network (WWAN)) includes base stations 102, UEs 104, an Evolved Packet Core (EPC) 160, and another core network 190 (e.g., a 5G Core (5GC)). The base stations 102 may include macrocells (high power cellular base station) and/or small cells (low power cellular base station). The macrocells include base stations. The small cells include femtocells, picocells, and microcells.

The base stations 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., S1 interface). The base stations 102 configured for 5G NR (collectively referred to as Next Generation RAN (NG-RAN)) may interface with core network 190 through second backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or core network 190) with each other over third backhaul links 134 (e.g., X2 interface). The first backhaul links 132, the second backhaul links 184, and the third backhaul links 134 may be wired or wireless.

In some aspects, a base station 102 or 180 may be referred as a RAN and may include aggregated or disaggregated components. As an example of a disaggregated RAN, a base station may include a central unit (CU) 106, one or more DUs 105, and/or one or more RUs 109, as illustrated in FIG. 1. A RAN may be disaggregated with a split between an RU 109 and an aggregated CU/DU. A RAN may be disaggregated with a split between the CU 106, the DU 105, and the RU 109. A RAN may be disaggregated with a split between the CU 106 and an aggregated DU/RU. The CU 106 and the one or more DUs 105 may be connected via an F1 interface. A DU 105 and an RU 109 may be connected via a fronthaul interface. A connection between the CU 106 and a DU 105 may be referred to as a midhaul, and a connection between a DU 105 and an RU 109 may be referred to as a fronthaul. The connection between the CU 106 and the core network may be referred to as the backhaul. The RAN may be based on a functional split between various components of the RAN, e.g., between the CU 106, the DU 105, or the RU 109. The CU may be configured to perform one or more aspects of a wireless communication protocol, e.g., handling one or more layers of a protocol stack, and the DU(s) may be configured to handle other aspects of the wireless communication protocol, e.g., other layers of the protocol stack. In different implementations, the split between the layers handled by the CU and the layers handled by the DU may occur at different layers of a protocol stack. As one, non-limiting example, a DU 105 may provide a logical node to host a radio link control (RLC) layer, a medium access control (MAC) layer, and at least a portion of a physical (PHY) layer based on the functional split. An RU may provide a logical node configured to host at least a portion of the PHY layer and radio frequency (RF) processing. A CU 106 may host higher layer functions, e.g., above the RLC layer, such as a service data adaptation protocol (SDAP) layer, a packet data convergence protocol (PDCP) layer. In other implementations, the split between the layer functions provided by the CU, DU, or RU may be different.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, WiMedia, Bluetooth, ZigBee, Wi-Fi based on the Institute of Electrical and Electronics Engineers (IEEE) 802.11 standard, LTE, or NR.

The wireless communications system may further include a Wi-Fi access point (AP) 150 in communication with Wi-Fi stations (STAs) 152 via communication links 154, e.g., in a 5 GHz unlicensed frequency spectrum or the like. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same unlicensed frequency spectrum (e.g., 5 GHz, or the like) as used by the Wi-Fi AP 150. The small cell 102', employing NR in an unlicensed frequency spectrum, may boost coverage to and/or increase capacity of the access network.

The electromagnetic spectrum is often subdivided, based on frequency/wavelength, into various classes, bands, channels, etc. In 5G NR, two initial operating bands have been identified as frequency range designations FR1 (410 MHz-7.125 GHz) and FR2 (24.25 GHz-52.6 GHz). Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR2-2 (52.6 GHz-71 GHz), FR4 (71 GHz-114.25 GHz), and FR5 (114.25 GHz-300 GHz). Each of these higher frequency bands falls within the EHF band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, FR4, FR2-2, and/or FR5, or may be within the EHF band.

A base station 102, whether a small cell 102' or a large cell (e.g., macro base station), may include and/or be referred to as an eNB, gNodeB (gNB), or another type of base station. Some base stations, such as gNB 180 may operate in a traditional sub 6 GHz spectrum, in millimeter wave frequencies, and/or near millimeter wave frequencies in communication with the UE 104. When the gNB 180 operates in millimeter wave or near millimeter wave frequencies, the gNB 180 may be referred to as a millimeter wave base station. The millimeter wave base station 180 may utilize beamforming 182 with the UE 104 to compensate for the path loss and short range. The base station 180 and the UE 104 may each include a plurality of antennas, such as antenna elements, antenna panels, and/or antenna arrays to facilitate the beamforming.

The base station 180 may transmit a beamformed signal to the UE 104 in one or more transmit directions 182'. The UE 104 may receive the beamformed signal from the base station 180 in one or more receive directions 182". The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The core network 190 may include an Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the core network 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a Packet Switch (PS) Streaming (PSS) Service, and/or other IP services.

The base station may include and/or be referred to as a gNB, Node B, eNB, an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or core network 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. In some scenarios, the term UE may also apply to one or more companion devices such as in a device constellation arrangement. One or more of these devices may collectively access the network and/or individually access the network.

Referring again to FIG. 1, in some aspects, the base station 180, such as the RU 109 or the DU 105, may include a compression component 198. In some aspects, the compression component 198 may be at the RU 109 and may be configured to receive, from a UE, uplink data via one or more active tones of a plurality of tones in a symbol, the uplink data corresponding to an access vector. In some aspects, the compression component 198 may be further configured to compress the uplink data based on a linear transformation of a pseudo-access vector generated based on the access vector, the linear transformation including a matrix, the compression enabling a second network entity to decompress the compressed uplink data without knowing one or more locations associated with the one or more active tones. The compression may enable a unit receiving the compressed uplink data to perform decompression without knowing the number of active tones or indices associated with the active tones. In some aspects, the compression component 198 may be further configured to transmit, to the second network entity, the compressed uplink data.

In some aspects, the compression component 198 may be at the RU 109 and may be configured to receive, from a second network entity, compressed downlink data. In some aspects, the compression component 198 may be further configured to decompress the compressed downlink data based on a minimization of a pseudo-access vector without knowing one or more locations associated with one or more active tones of a plurality of tones in a symbol, the decompressed downlink data corresponding to the one or more active tones. In some aspects, the compression component 198 may be further configured to transmit, to a UE, the decompressed downlink data, the decompressed downlink data corresponding to the pseudo-access vector.

In some aspects, the compression component 198 may be at the DU 105 and may be configured to receive, from a first network entity, compressed uplink data. In some aspects, the compression component 198 may be further configured to decompress the compressed uplink data based on a minimization of a pseudo-access vector without knowing one or more locations associated with one or more active tones of a plurality of tones in a symbol, the decompressed uplink data corresponding to one or more active tones. In some aspects, the compression component 198 may be further configured to transmit, to at least one other network entity, the decompressed uplink data.

In some aspects, the compression component 198 may be at the DU 105 and may be configured to receive, from at least one other network entity, downlink data via one or more active tones of a plurality of tones in a symbol, the downlink data corresponding to a vector. In some aspects, the compression component 198 may be further configured to compress the downlink data based on a linear transformation of a pseudo-access vector generated based on the access vector, the linear transformation including a matrix, the compression enabling a first network entity to decompress the compressed downlink data without knowing one or more locations associated with the one or more active tones. In some aspects, the compression component 198 may be further configured to transmit, to the first network entity, the compressed downlink data.

Although the following description may be focused on 5G NR, the concepts described herein may be applicable to other similar areas, such as LTE, LTE-A, CDMA, GSM, and other wireless technologies.

Figure 2:
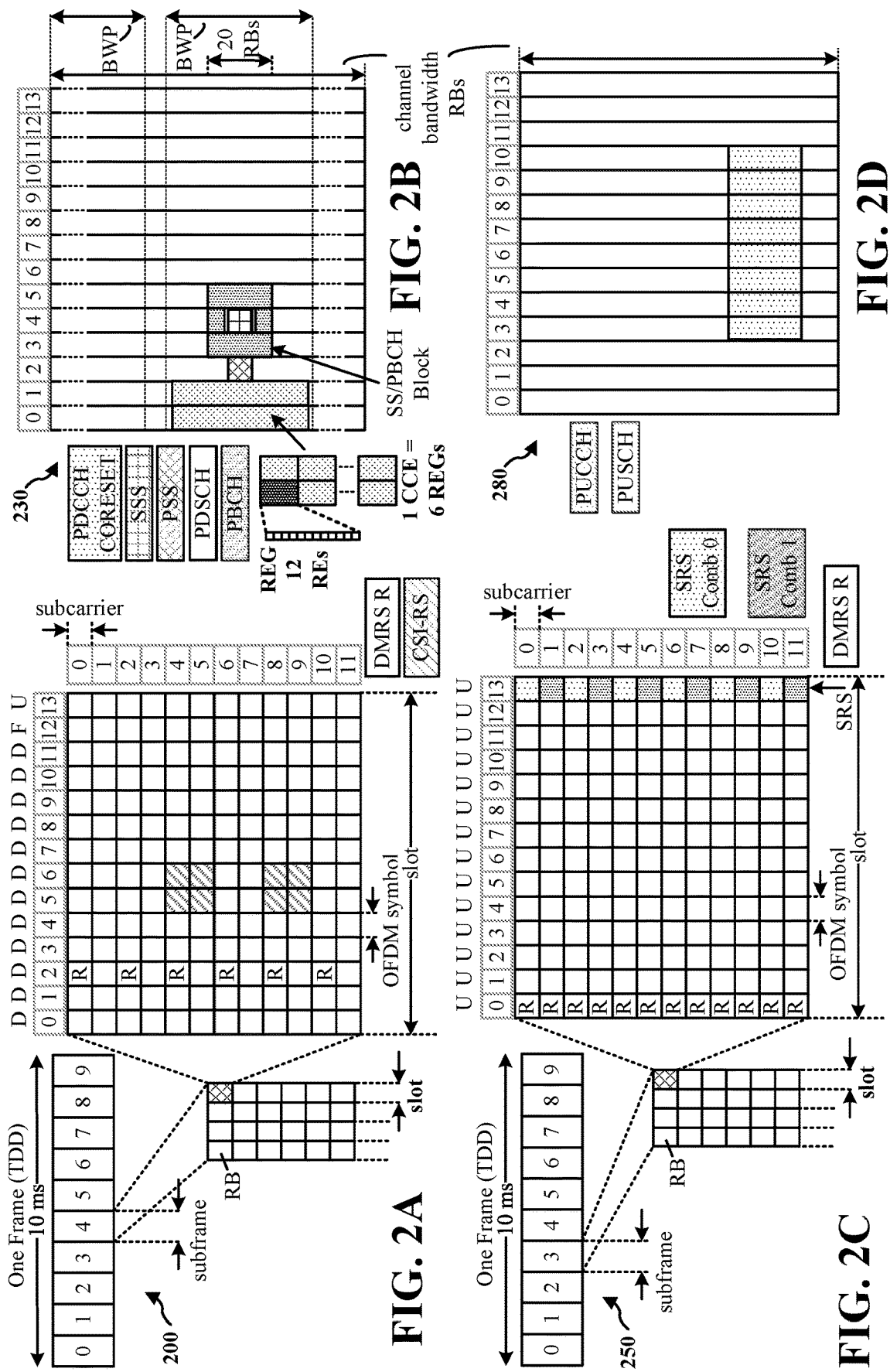
FIG. 2A is a diagram illustrating an example of a first frame, in accordance with various aspects of the present disclosure.
FIG. 2B is a diagram illustrating an example of DL channels within a subframe, in accordance with various aspects of the present disclosure.
FIG. 2C is a diagram illustrating an example of a second frame, in accordance with various aspects of the present disclosure.
FIG. 2D is a diagram illustrating an example of UL channels within a subframe, in accordance with various aspects of the present disclosure.

FIG. 2A is a diagram 200 illustrating an example of a first subframe within a 5G NR frame structure. FIG. 2B is a diagram 230 illustrating an example of DL channels within a 5G NR subframe. FIG. 2C is a diagram 250 illustrating an example of a second subframe within a 5G NR frame structure. FIG. 2D is a diagram 280 illustrating an example of UL channels within a 5G NR subframe. The 5G NR frame structure may be frequency division duplexed (FDD) in which for a particular set of subcarriers (carrier system bandwidth), subframes within the set of subcarriers are dedicated for either DL or UL, or may be time division duplexed (TDD) in which for a particular set of subcarriers (carrier system bandwidth), subframes within the set of subcarriers are dedicated for both DL and UL. In the examples provided by FIGS. 2A, 2C, the 5G NR frame structure is assumed to be TDD, with subframe 4 being configured with slot format 28 (with mostly DL), where D is DL, U is UL, and F is flexible for use between DL/UL, and subframe 3 being configured with slot format 1 (with all UL). While subframes 3, 4 are shown with slot formats 1, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G NR frame structure that is TDD.

FIGS. 2A-2D illustrate a frame structure, and the aspects of the present disclosure may be applicable to other wireless communication technologies, which may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 14 or 12 symbols, depending on whether the cyclic prefix (CP) is normal or extended. For normal CP, each slot may include 14 symbols, and for extended CP, each slot may include 12 symbols. The symbols on DL may be CP orthogonal frequency division multiplexing (OFDM) (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the CP and the numerology. The numerology defines the subcarrier spacing (SCS) and, effectively, the symbol length/duration, which is equal to 1/SCS.

| μ | SCS<br>Δf = $2^μ$ · 15[kHz] | Cyclic prefix |
|---|---|---|
| 0 | 15 | Normal |
| 1 | 30 | Normal |
| 2 | 60 | Normal, Extended |
| 3 | 120 | Normal |
| 4 | 240 | Normal |

For normal CP (14 symbols/slot), different numerologies μ 0 to 4 allow for 1, 2, 4, 8, and 16 slots, respectively, per subframe. For extended CP, the numerology 2 allows for 4 slots per subframe. Accordingly, for normal CP and numerology μ, there are 14 symbols/slot and $2^μ$ slots/subframe. The subcarrier spacing may be equal to $2^μ*15$ kHz, where μ is the numerology 0 to 4. As such, the numerology μ=0 has a subcarrier spacing of 15 kHz and the numerology μ=4 has a subcarrier spacing of 240 kHz. The symbol length/duration is inversely related to the subcarrier spacing. FIGS. 2A-2D provide an example of normal CP with 14 symbols per slot and numerology μ=2 with 4 slots per subframe. The slot duration is 0.25 ms, the subcarrier spacing is 60 kHz, and the symbol duration is approximately 16.67 μs. Within a set of frames, there may be one or more different bandwidth parts (BWPs) (see FIG. 2B) that are frequency division multiplexed. Each BWP may have a particular numerology and CP (normal or extended).

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as R for one particular configuration, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs) (e.g., 1, 2, 4, 8, or 16 CCEs), each CCE including six RE groups (REGs), each REG including 12 consecutive REs in an OFDM symbol of an RB. A PDCCH within one BWP may be referred to as a control resource set (CORESET). A UE is configured to monitor PDCCH candidates in a PDCCH search space (e.g., common search space, UE-specific search space) during PDCCH monitoring occasions on the CORESET, where the PDCCH candidates have different DCI formats and different aggregation levels. Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and hybrid automatic repeat request (HARQ) acknowledgment (ACK) (HARQ-ACK) feedback (i.e., one or more HARQ ACK bits indicating one or more ACK and/or negative ACK (NACK)). The PUSCH carries data, and may additionally be used to carry a buffer status report (BSR), a power headroom report (PHR), and/or UCI.

Figure 3:
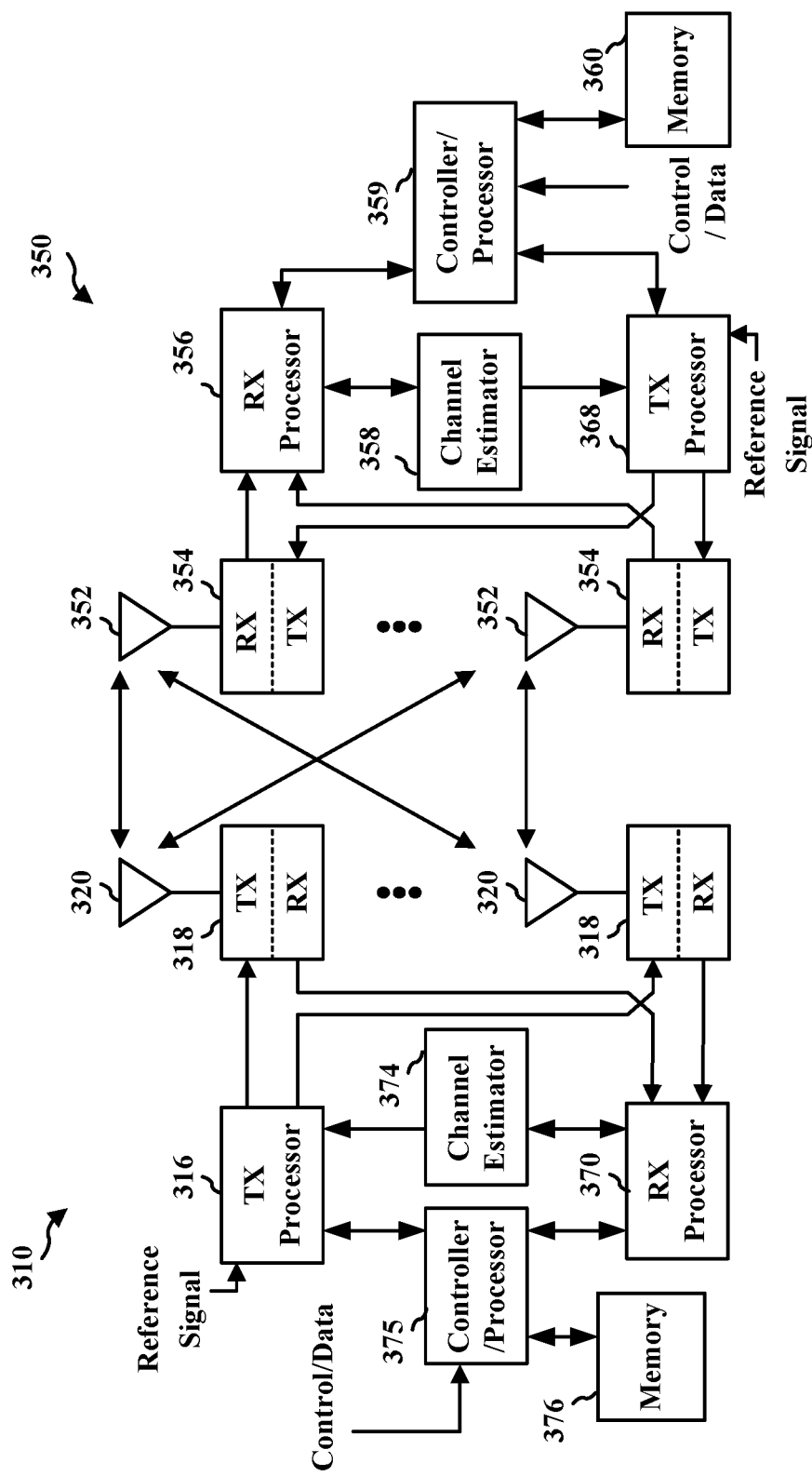
FIG. 3 is a diagram illustrating an example of a base station and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318 TX. Each transmitter 318 TX may modulate a radio frequency (RF) carrier with a respective spatial stream for transmission.

At the UE 350, each receiver 354 RX receives a signal through its respective antenna 352. Each receiver 354 RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

At least one of the TX processor 316, the RX processor 370, and the controller/processor 375 may be configured to perform aspects in connection with the compression component 198 of FIG. 1.

In a wireless communication, a RAN may be split into different network entities, such as an RU, a DU, and a CU, as previously described in connection with RU 109, DU 105, and CU 106 in FIG. 1. A connection or link between the DU and the RU may be referred to as a fronthaul connection or a fronthaul link. Data compression for the purpose of transmitting via a fronthaul link may be referred to as fronthaul compression. Fronthaul compression may facilitate reducing fronthaul capacity without degrading the end-to-end performance, which may enable more efficient and less costly implementation of a RAN. For example, with 2:1 compression (which may be otherwise referred to as 50% compression), it may be possible to have a same infrastructure support twice as much data rate if the fronthaul link is the bottleneck of the communication system. Moreover, with fronthaul compression, energy may be saved.

Sparse access use cases may be present in some wireless communication systems. For example, URLLC transmission may be bursty, i.e., data may be intermittently transmitted in short and uneven bursts instead of transmitted continuously. As another example, massive machine type communications (mMTC) may also be random and grantless (i.e., transmissions by a UE may not be scheduled by a grant). As another example, industrial Internet of things (IIoT) communications may also be associated with sparse access with intermittent traffic. Based on the sparsity of sparse access traffic, some aspects provided herein may provide a fronthaul compression for sparse access or provide a fronthaul compression for dense access via sparse recovery and support. Utilizing compression methods provided herein, network entities, such as an RU or a DU at a base station, may compress data with more accuracy, which may in turn lead to saved resources, energy, and better communication quality.

Figure 4:
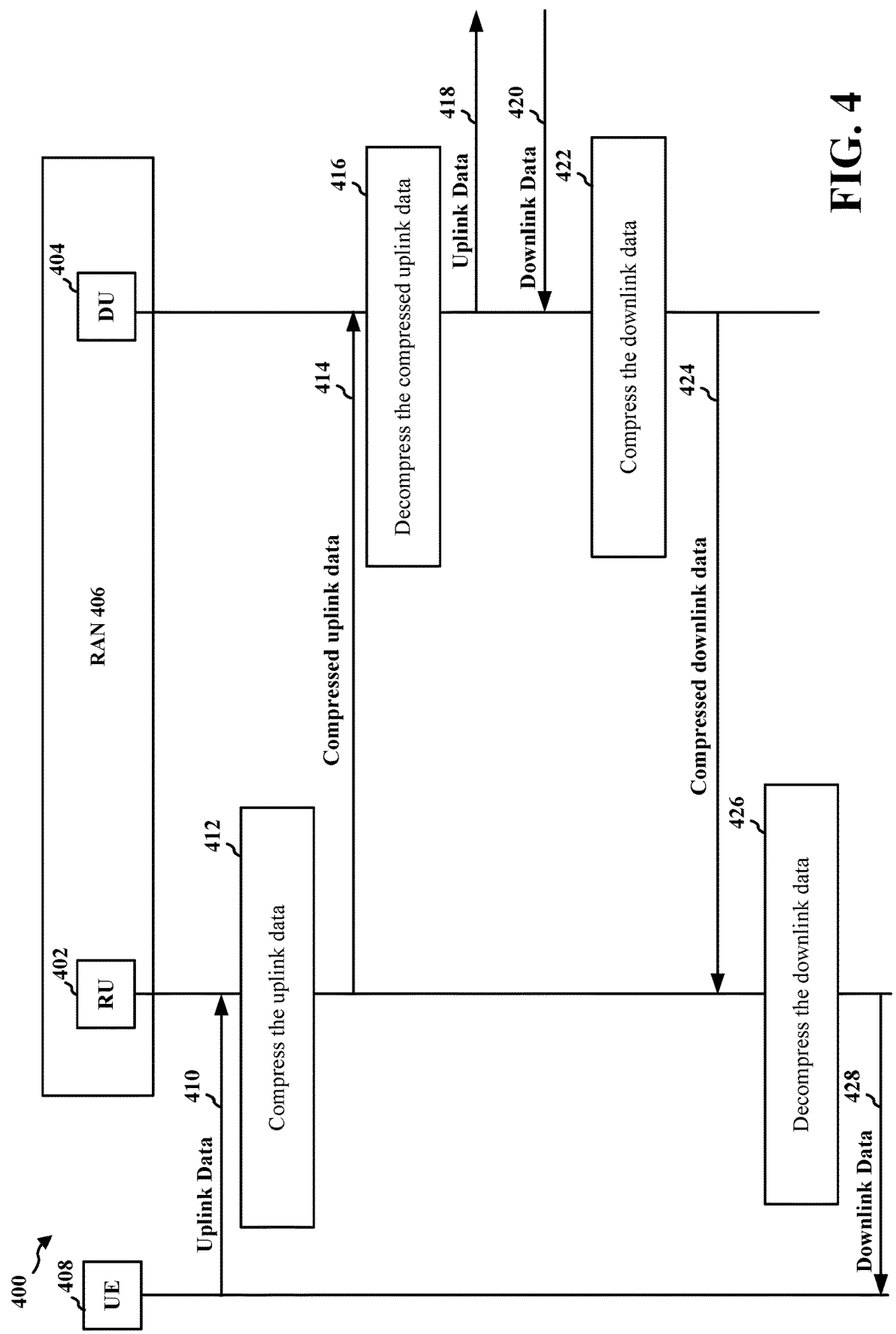
FIG. 4 is a diagram illustrating communication flow between different network entities and a UE.
Figure 5:
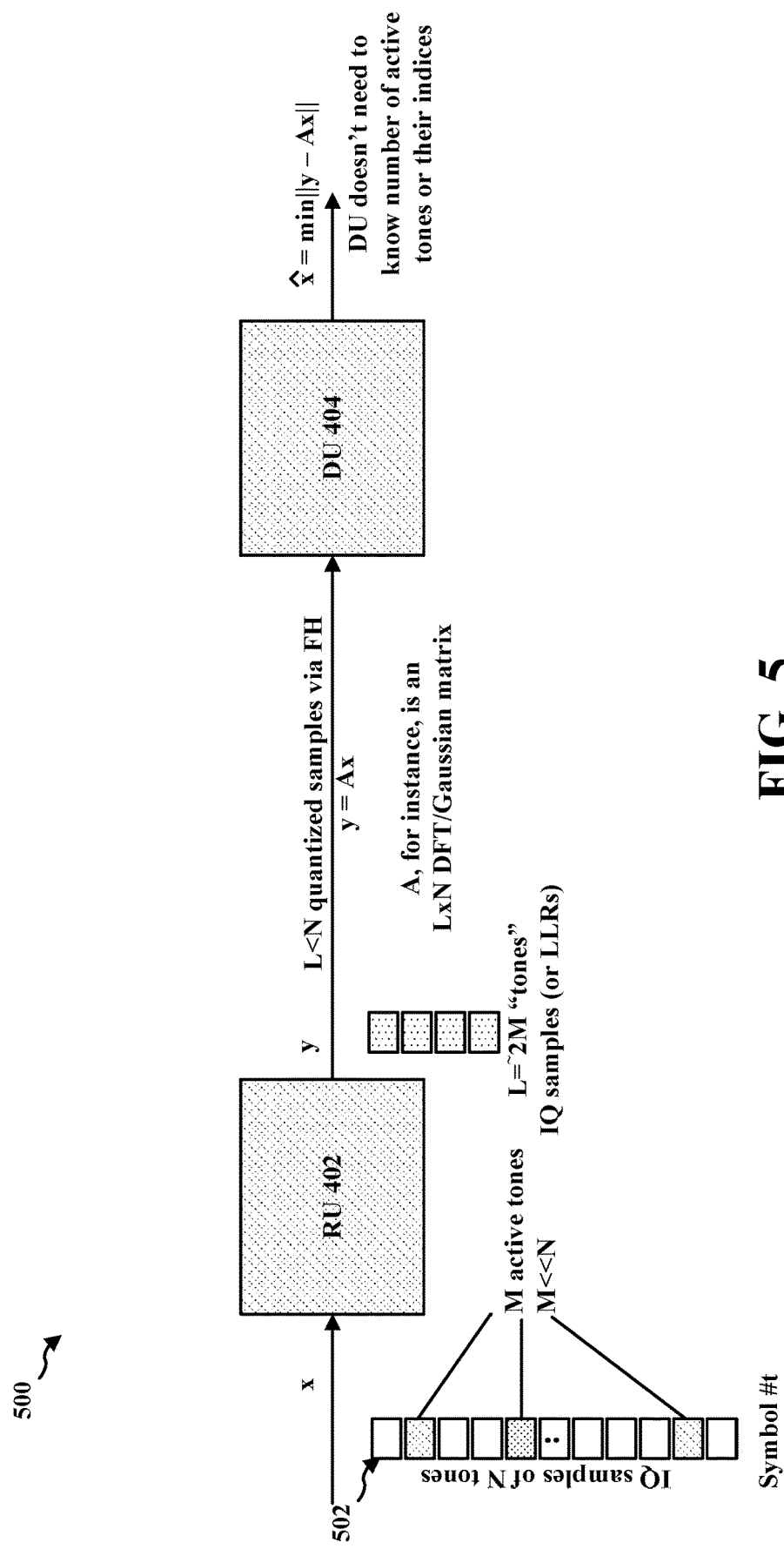
FIG. 5 is a diagram illustrating communication between an RU and a DU.

FIG. 4 is a diagram 400 illustrating communication flow between different network entities and a UE. As illustrated in FIG. 4, a RAN 406 may include an RU 402 and a DU 404, the RU 402 may be further in connection with a UE 408. To transmit uplink data 410, the UE 408 may first transmit the uplink data 410 to the RU 402. The RU 402 may accordingly compress the uplink data 410 at 412, and then transmit compressed uplink data 414 to the DU 404 via a fronthaul link. For example, as illustrated in example 500 of FIG. 5, in some circumstances, the uplink data 410 from the UE 408 may be associated with sparse access. As illustrated in FIG. 5, for a symbol t in the uplink data 410, the symbol t may be carried by M active tones (which may be otherwise referred to as subcarriers) in N tones in an access vector 502, where M may be much smaller than N (hence sparse). For example, if M is below 35% of N, the communication between the UE 408 and the RU 402 may be sparse access. The uplink data may be carried by one or more in-phase and quadrature (IQ) samples. An access vector associated with the uplink data 410 may be denoted by "x" in FIG. 5. Without compression, the RU 402 may directly transmit N IQ samples to the DU 404, or transmit IQ samples corresponding to the M active tones to the DU 404 along with a tone index indicating the active tones. The compression at 412 may enable a unit receiving the compressed uplink data to perform decompression without knowing the number of active tones or indices associated with the active tones. Based on the compression at 412, the RU 402 may project the N tones (which may be in the form of a sparse access vector) onto a reduced dimensionality hyperspace y of length L, where L may be twice of M or above. As one example, if M is below 35% of N, the reduced dimensionality hyperspace y of length L is smaller than the original N tones. The projection may be done using a projection matrix chosen by the RU 402, which may be a restricted isometric property (RIP) matrix, a discrete Fourier transform (DFT) matrix, or a Gaussian matrix. In some aspects, y may be equal to Ax̃, where A denotes the projection matrix and X denotes a pseudo-access vector that is generated based on the IQ samples corresponding to the M active tones. The projected reduced dimensionality hyperspace y of length L may be the compressed uplink data 414.

Upon receiving the compressed uplink data 414, the DU 404 may decompress the compressed uplink data 414 at 416. After decompressing the compressed uplink data 414, the DU 404 may transmit the decompressed uplink data 418 to another network entity, such as a CU. To decompress the compressed uplink data 414 in the form of a projected reduced dimensionality hyperspace y of length L and recover an approximation of the original vector x, x̂ or $x_{approx}$, the DU 404 may run an L1 norm (which may be otherwise referred to as a Manhattan norm and may be the sum of the magnitudes of all the vectors in the hyperspace y) minimization, which may be denoted by $x_{approx}=\min\|y-A\tilde{x}\|$. In some aspects, the L1 norm minimization may include least absolute shrinkage and selection operator (LASSO) and approximate message passing (AMP). The DU 404 may be able to perform the decompression without knowing the number of active tones or indices associated with the active tones via the L1 norm minimization (which may also be referred to as sparse recovery). In some aspects, the number of active tones or indices may not be transmitted.

Figure 6:
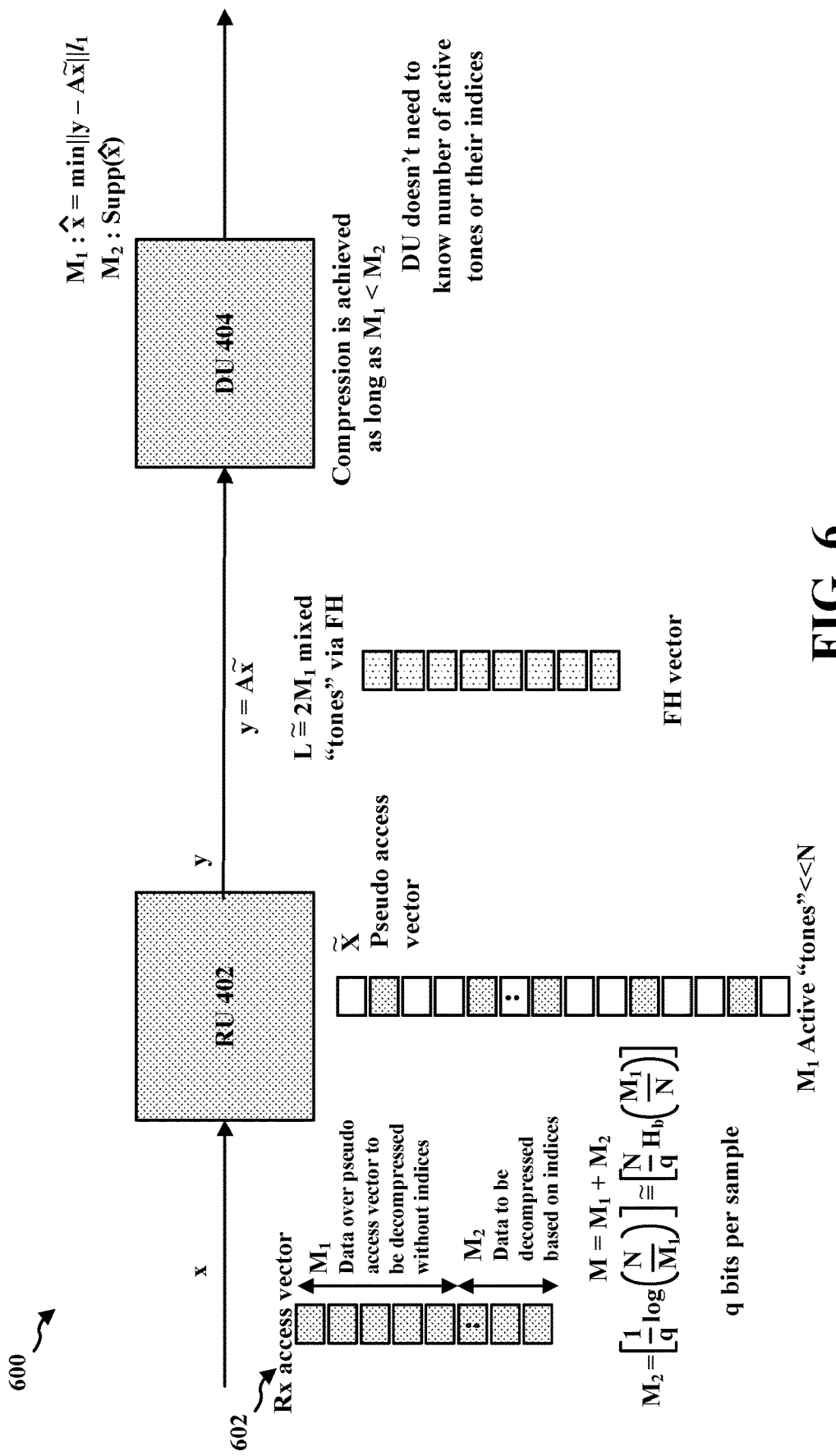
FIG. 6 is a diagram illustrating communication between an RU and a DU.

Alternatively, if the uplink data 410 is dense access, as illustrated in example 600 of FIG. 6, for a symbol t in the uplink data 410, the symbol t may be carried by M tones in an access vector 602, the M tones may be split into two sub-vectors of size M1 and M2. The first sub-vector may include M1 tones mapped by the RU 402 to a pseudo-access vector x̃. The pseudo-access vector x may include M1 active tones in a total of N tones, where M1 may be much smaller than N and may be sparse access. The second sub-vector may include the M2 tones that are not mapped in the first sub-vector and the M2 tones may be front-hauled via indices associated with the pseudo-access vector x̃. As one example, the M2 tones may be determined based on $$M_2 = \left\lfloor \frac{1}{q}\log\binom{N}{M_1} \right\rfloor \cong \left\lfloor \frac{N}{q}H_b\left(\frac{M_1}{N}\right) \right\rfloor,$$

where q indicates bits per sample representing fronthaul sampling unit (which may be otherwise referred to as a "quantization resolution"), N may indicate the total length of the pseudo-access vector x̃, and $H_b$ may indicate the binary entropy of M. The size of M2 may be a number of possible sizes that M1 may support in a sparse vector of length N. M2 may also be N times the binary entropy of M1 based on Stirling's approximation of factorials.

Similar to the sparse access aspects, based on the compression at 412, the RU 402 may project the N tones in the pseudo-access vector X onto a reduced dimensionality hyperspace y of length L, where L may be twice of M or above. The projection may be done using a projection matrix chosen by the RU 402, which may be an RIP matrix, a DFT matrix, or a Gaussian matrix. In some aspects, y may be equal to Ax̃, where A denotes the projection matrix and x̃ denotes a pseudo-access vector that is generated based on the IQ samples corresponding to the M active tones. The projected reduced dimensionality hyperspace y of length L may be the compressed uplink data 414. The uplink data 414 may further include indices associated with the M2 tones.

Similar to the sparse access aspects, upon receiving the compressed uplink data 414, the DU 404 may decompress the compressed uplink data 414 at 416. After decompressing the compressed uplink data 414, the DU 404 may transmit the decompressed uplink data 418 to another network entity, such as a CU. To decompress the compressed uplink data 414 in the form of a projected reduced dimensionality hyperspace y of length L, the DU 404 may run an L1 norm (which may be otherwise referred to as a Manhattan norm and may be the sum of the magnitudes of all the vectors in the hyperspace y) minimization, which may be denoted by $x_{approx}=\min\|y-A\tilde{x}\|$ subject to y=Ax̃. In addition, the pseudo-access vector x̃ may be mapped back to the M2 tones based on the indices associated with the M2 tones. In some aspects, the L1 norm minimization may be LASSO and AMP. The DU 404 may be able to perform the decompression without knowing the number of active tones or indices associated with the active tones. The table below may illustrate an example compression rate:

| N | IQ Samples used without compression | IQ Samples used with compression | Compression savings |
|---|---|---|---|
| 1,000 | 53 | 50 | 6% |
| 10,000 | 67 | 50 | 25% |
| 100,000 | 80 | 50 | 38% |
| 1,000,000 | 94 | 50 | 47% |
| 1 RB, $M_1 = 5$, $M_2 = 7$ | | | |
| 1,000 | 12 | 10 | 17% |

To transmit downlink data 420 to a UE, the DU 404 may receive the downlink data 420 from another network entity, such as a CU. Upon receiving the downlink data 420 from the CU, the DU 404 may compress the downlink data 420 at 422. After compressing the downlink data 420, the DU 404 may transmit the compressed downlink data 424 to the RU 402 via a fronthaul link. The compression may be similar to the RU 402's compression of the uplink data 410. For example, in some circumstances, the downlink data 420 may be sparse access. For a symbol t in the downlink data 420, the symbol t may be carried by M active tones (which may be otherwise referred to as subcarriers) in N tones in an access vector, where M may be much smaller than N (hence sparse). For example, if M is below 35% of N, the communication between the UE 408 and the RU 402 may be sparse access. The downlink data may be carried by one or more in-phase and quadrature (IQ) samples. An access vector associated with the downlink data 420 may be denoted by "x". Without compression, the DU 404 may directly transmit N IQ samples to the RU 402, or transmit IQ samples corresponding to the M active tones to the RU 402 along with a tone index indicating the active tones. Based on the compression at 422, the DU 404 may project the N tones (which may be in the form of a sparse access vector) onto a reduced dimensionality hyperspace y of length L, where L may be twice of M or above. As one example, if M is below 35% of N, the reduced dimensionality hyperspace y of length L is smaller than the original N tones. The projection may be done using a projection matrix chosen by the RU 402, which may be an RIP matrix, a DFT matrix, or a Gaussian matrix. In some aspects, y may be equal to A$\tilde{x}$, where A denotes the projection matrix and X denotes a pseudo-access vector that is generated based on the IQ samples corresponding to the M active tones. The projected reduced dimensionality hyperspace y of length L may be the compressed downlink data 424.

Upon receiving the compressed downlink data 424 from the DU 404, the RU 402 may decompress the compressed downlink data 424 at 426. The decompression may be similar to the DU 404's decompression of the compressed uplink data 414. After decompressing the compressed downlink data 424, the RU 402 may transmit the decompressed downlink data 428 to the UE 408. To decompress the compressed uplink data 424 in the form of a projected reduced dimensionality hyperspace y of length L and recover an approximation of the original vector x, $\tilde{x}$ or $x_{approx}$, the RU 402 may run an L1 norm (which may be otherwise referred to as a Manhattan norm and may be the sum of the magnitudes of all the vectors in the hyperspace y) minimization, which may be denoted by $x_{approx}=\min\|y-A\tilde{x}\|$ subject to $y=A\tilde{x}$. In some aspects, the L1 norm minimization may include LASSO and AMP. The RU 402 may be able to perform the decompression without knowing the number of active tones or indices associated with the active tones via the L1 norm minimization (which may also be referred to as sparse recovery). In some aspects, the number of active tones or indices may not be transmitted.

Alternatively, if the downlink data 420 is dense access, for a symbol t in the downlink data 420, the symbol t may be carried by M tones in an access vector, the M tones may be split into two sub-vectors of size M1 and M2. The first sub-vector may include M1 tones mapped by the DU 404 to a pseudo-access vector R. The pseudo-access vector $\tilde{x}$ may include M1 active tones in a total of N tones, where M1 may be much smaller than N and may be sparse access. The second sub-vector may include the M2 tones that are not mapped in the first sub-vector and the M2 tones may be front-hauled via indices associated with the pseudo-access vector $\tilde{x}$. As one example, the M2 tones may be determined based on $$M_2 = \left\lfloor \frac{1}{q}\log\binom{N}{M_1} \right\rfloor \cong \left\lfloor \frac{N}{q} H_b\left(\frac{M_1}{N}\right) \right\rfloor,$$

where q indicates bits per sample representing fronthaul sampling unit (which may be otherwise referred to as a "quantization resolution"), N may indicate the total length of the pseudo-access vector $\tilde{x}$, and $H_b$ may indicate the binary entropy of M. The size of M2 may be a number of possible sizes that M1 may support in a sparse vector of length N. M2 may also be N times the binary entropy of M1 based on Stirling's approximation of factorials.

Similar to the sparse access aspects, based on the compression at 422, the DU 404 may project the N tones in the pseudo-access vector $\tilde{x}$ onto a reduced dimensionality hyperspace y of length L, where L may be twice of M or above. The projection may be done using a projection matrix chosen by the DU 404, which may be an RIP matrix, a DFT matrix, or a Gaussian matrix. In some aspects, y may be equal to A$\tilde{x}$, where A denotes the projection matrix and $\tilde{x}$ denotes a pseudo-access vector that is generated based on the IQ samples corresponding to the M1 active tones. The projected reduced dimensionality hyperspace y of length L may be the compressed downlink data 424. The downlink data 424 may further include indices associated with the M2 tones.

Similar to the sparse access aspects, upon receiving the compressed downlink data 424, the RU 402 may decompress the compressed downlink data 424 at 426. To decompress the compressed downlink data 414 in the form of a projected reduced dimensionality hyperspace y of length L, the RU 402 may run an L1 norm (which may be otherwise referred to as a Manhattan norm and may be the sum of the magnitudes of all the vectors in the hyperspace y) minimization, which may be denoted by $x_{approx}=\min\|y-A\tilde{x}\|$. In addition, the pseudo-access vector $\tilde{x}$ may be mapped back to the M2 tones based on the indices associated with the M2 tones. The indices may be received as part of the compressed downlink data 424. In some aspects, the L1 norm minimization may be LASSO and AMP. The RU 402 may be able to perform the decompression without knowing the number of active tones or indices associated with the active tones.

Figure 7:
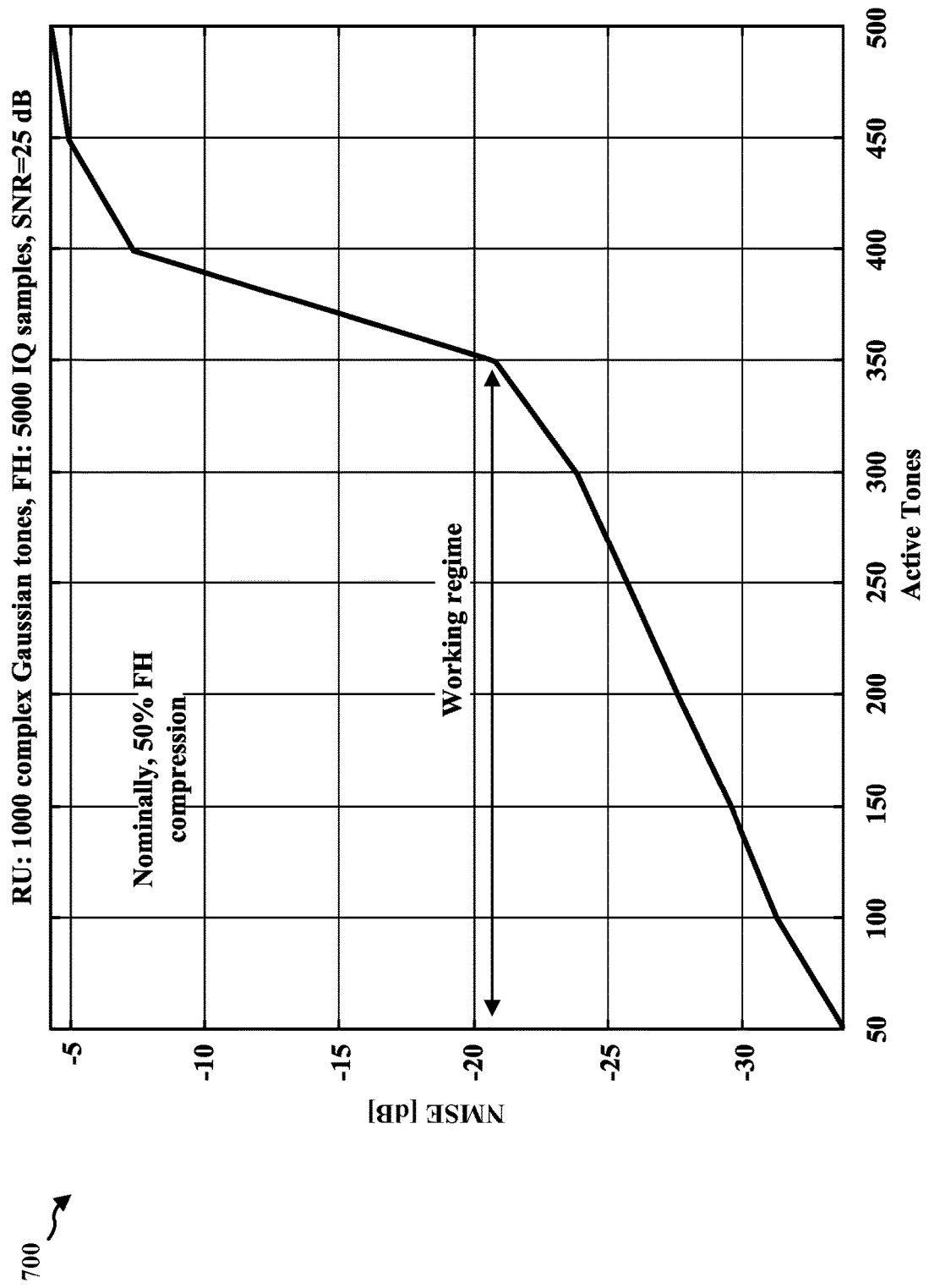
FIG. 7 is a diagram illustrating an example sparse access compression.

FIG. 7 is a diagram 700 illustrating an example sparse access compression. As illustrated in FIG. 7, for a total of N=1000 tones and 250 active M tones, 500 IQ samples may be transmitted and a signal-to-noise ratio (SNR) may be 25 decibels (dB). Also, a 50% compression rate may be achieved.

Figure 8:
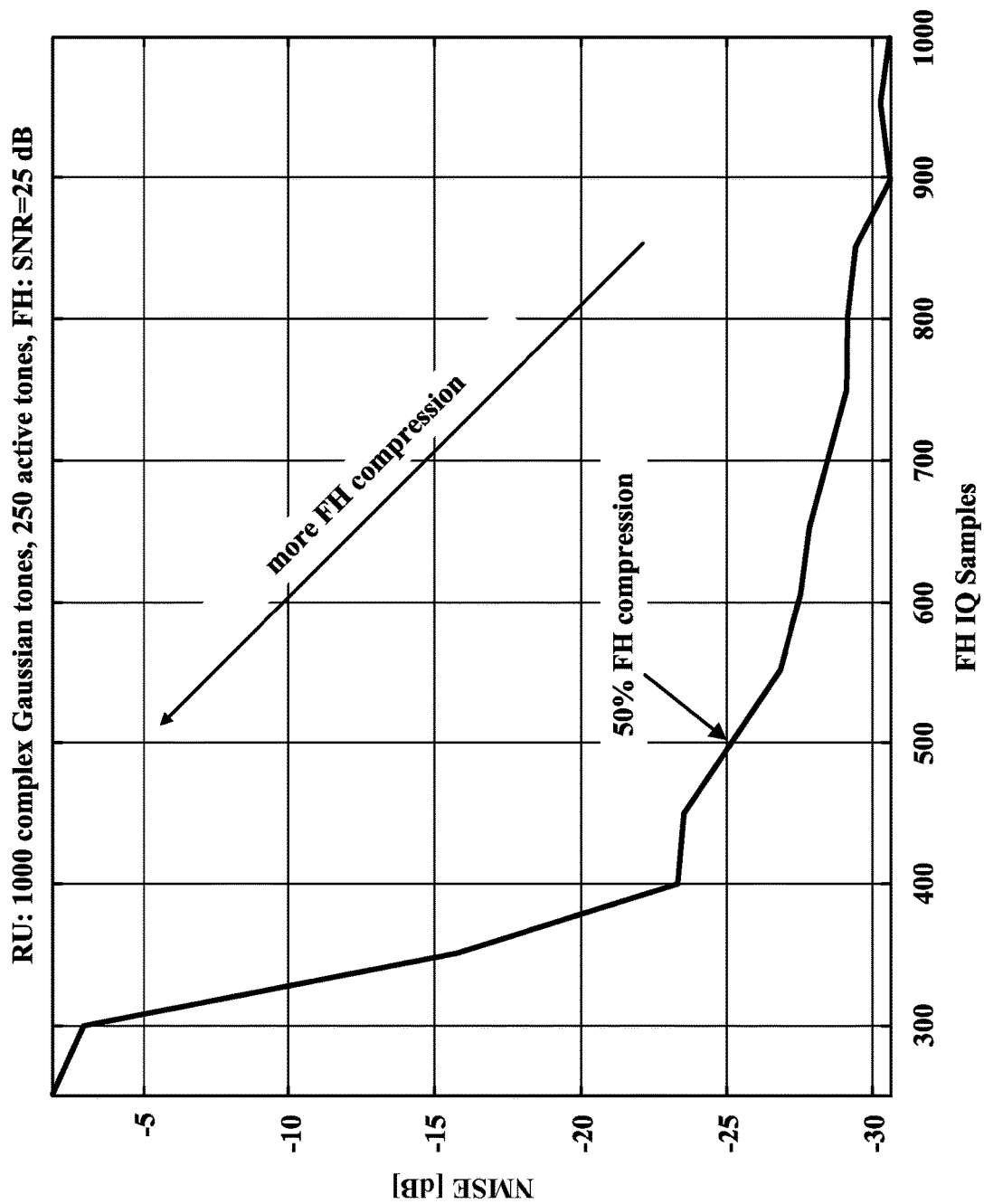
FIG. 8 is a diagram illustrating an example compression.

FIG. 8 is a diagram 800 illustrating an example compression. As illustrated in FIG. 8, for a total of N=1000 tones, depending on the number of active tones, with a 50% compression rate, a normalized mean square error (NMSE) may range from −35 dB to −5 dB.

Figure 9:
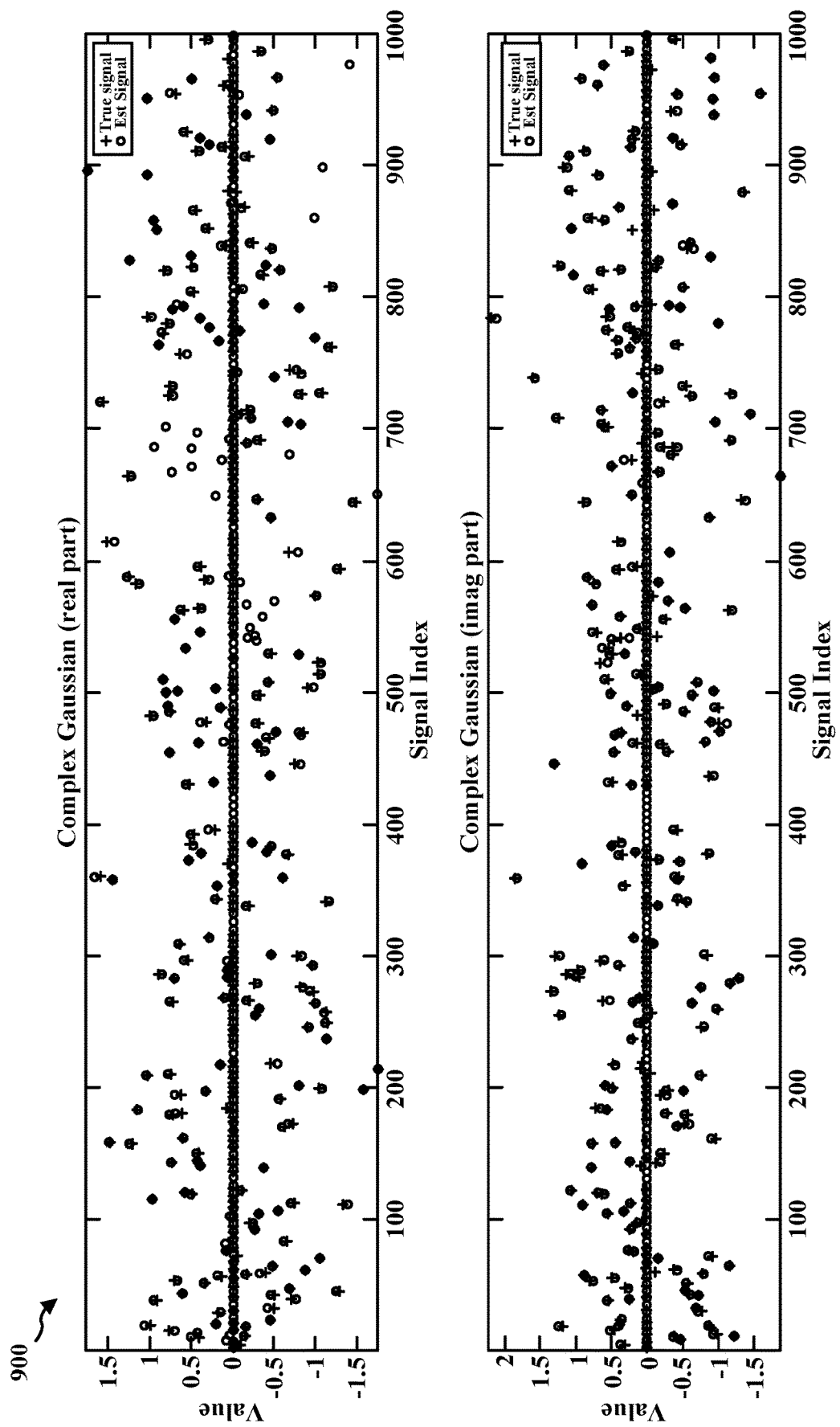
FIG. 9 is a diagram illustrating an example compression.

FIG. 9 is a diagram 900 illustrating an example compression. As illustrated in FIG. 8, for a total of N=1000 tones, if there are 250 active M tones, depending on the number of IQ samples used, the NMSE may range from −35 dB to −5 dB.

Figure 10:
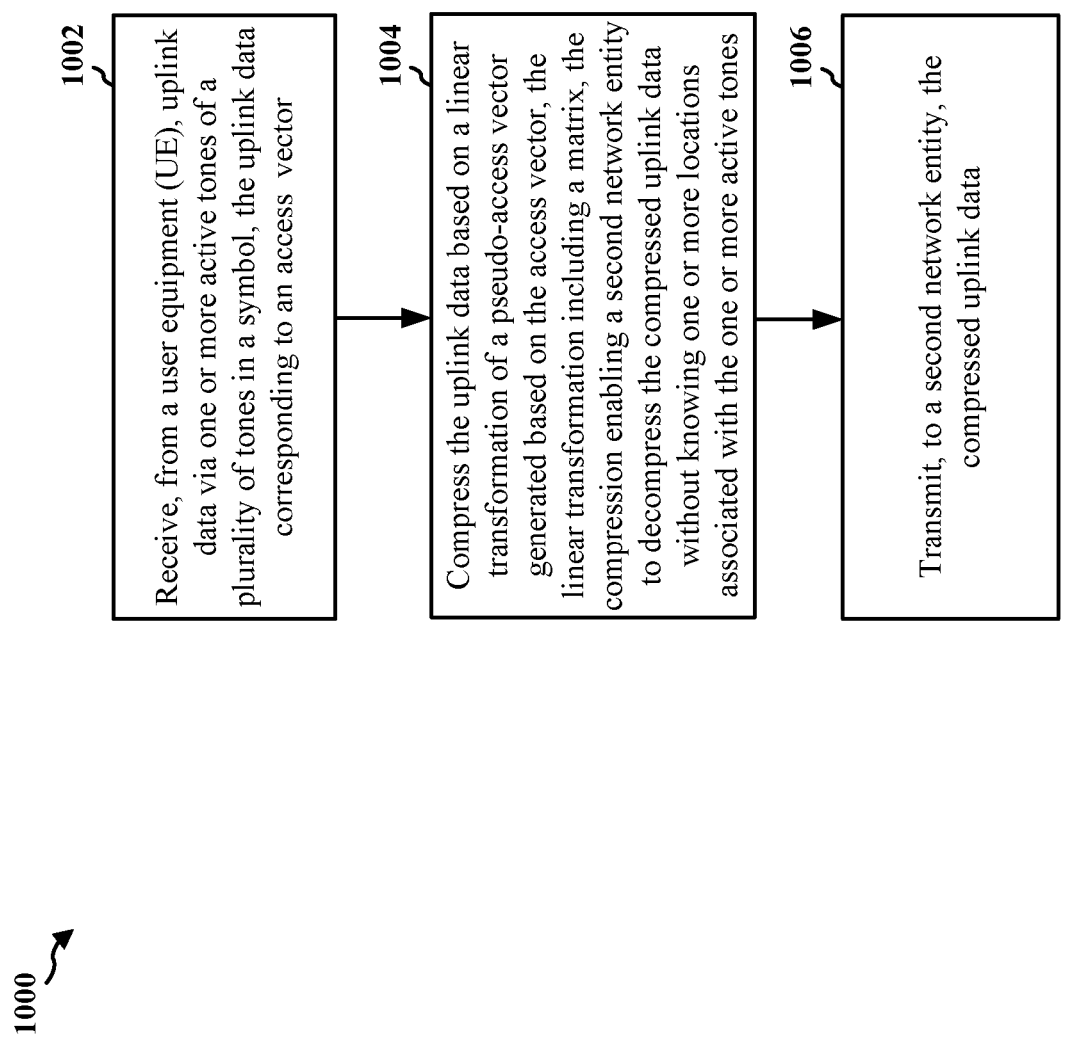
FIG. 10 is a flowchart of a method of wireless communication.

FIG. 10 is a flowchart 1000 of a method of wireless communication. The method may be performed by a base station, such as an RU of a base station (e.g., the base station 102/180, the RU 109, the RU 402, the RAN 406, the apparatus 1402).

At 1002, the RU may receive, from a UE, uplink data via one or more active tones of a plurality of tones in a symbol, the uplink data corresponding to an access vector. For example, the RU 402 may receive, from a UE 408, uplink data 410 via one or more active tones of a plurality of tones in a symbol, the uplink data corresponding to an access vector. In some aspects, 1002 may be performed by uplink component 1442 in FIG. 14. In some aspects, the one or more active tones may be equal to M and the plurality of tones may be equal to N, and M<N.

At 1004, the RU may compress the uplink data based on a linear transformation of a pseudo-access vector generated based on the access vector, the linear transformation including a matrix. The compression may enable a second network entity to decompress the compressed uplink data without knowing one or more locations associated with the one or more active tones. For example, the RU 402 may compress the uplink data based on a linear transformation of a pseudo-access vector generated based on the access vector at 412. In some aspects, 1004 may be performed by compression component 1444 in FIG. 14. In some aspects, a size of the matrix may be equal to L*N, and L≥2M. In some aspects, the linear transformation may correspond to y=A*x̃, where A is the matrix and x̃ is the pseudo-access vector. In some aspects, the matrix may be an RIP matrix, a DFT matrix, or a Gaussian matrix. In some aspects, the compression may correspond to a fronthaul compression. In some aspects, the access vector is divided into a first sub-vector and a second sub-vector. The first sub-vector may correspond to the pseudo-access vector mapped to a first portion of the plurality of tones and the second sub-vector may include a second portion of the plurality of tones. In some aspects, the second portion of the plurality of tones may be associated with one or more transmitted indices indicating one or more locations associated with the second portion of the plurality of tones.

At 1006, the RU may transmit, to the second network entity, the compressed uplink data. For example, the RU 402 may transmit, to the second network entity (e.g., DU 404), the compressed uplink data 414. In some aspects, 1006 may be performed by uplink component 1442 in FIG. 14.

Figure 11:
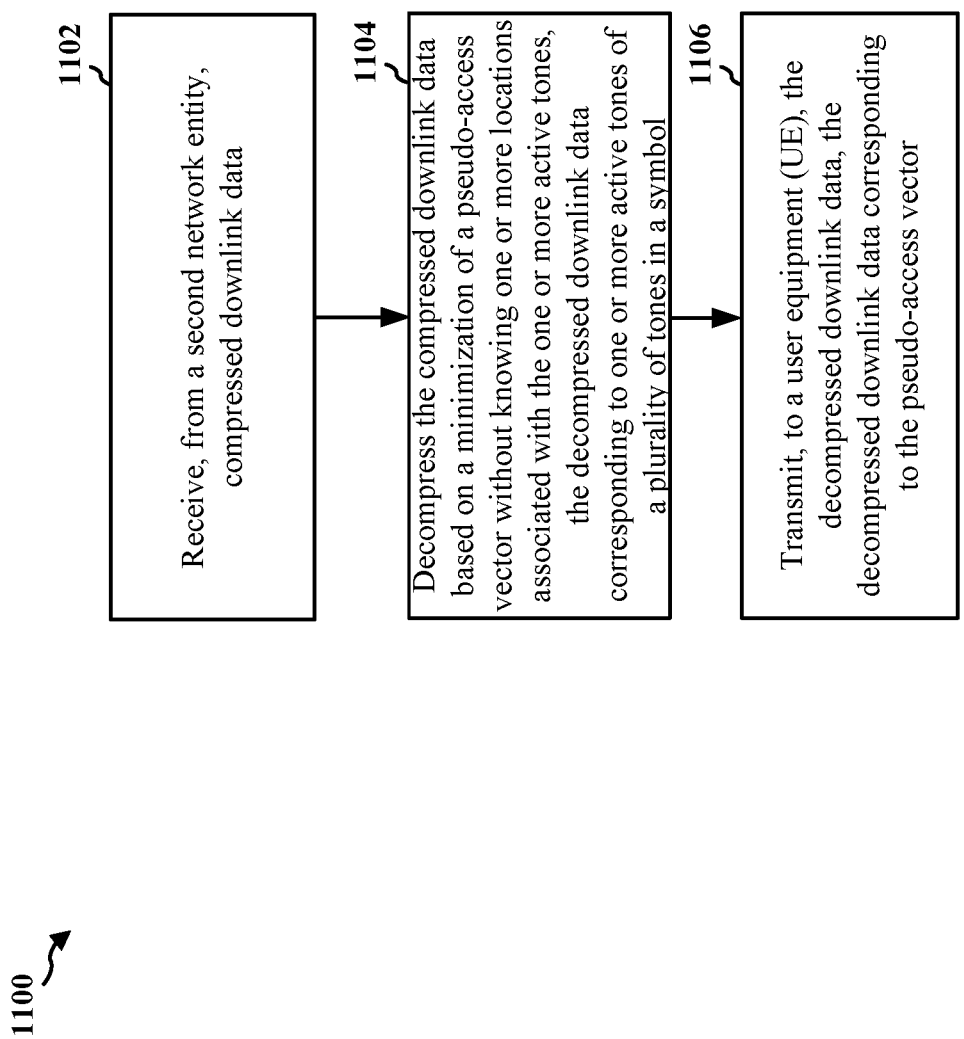
FIG. 11 is a flowchart of a method of wireless communication.

FIG. 11 is a flowchart 1100 of a method of wireless communication. The method may be performed by a base station, such as an RU of a base station (e.g., the base station 102/180, the RU 109, the RU 402, the RAN 406, the apparatus 1402).

At 1102, the RU may receive, from a second network entity, compressed downlink data. For example, the RU 402 may receive, from a second network entity (e.g., the DU 404), compressed downlink data 424. In some aspects, 1102 may be performed by downlink component 1446 in FIG. 14.

At 1104, the RU may decompress the compressed downlink data based on a minimization of a pseudo-access vector without knowing one or more locations associated with one or more active tones of a plurality of tones in a symbol. The decompressed downlink data may correspond to the one or more active tones. For example, the RU 402 may decompress the compressed downlink data based on a minimization of a pseudo-access vector without knowing one or more locations associated with the one or more active tones at 426. In some aspects, 1104 may be performed by compression component 1444 in FIG. 14. In some aspects, the minimization of the pseudo-access vector may be a Manhattan norm. In some aspects, the minimization of the pseudo-access vector may correspond to $x_{approx}=\min\|y-A\tilde{x}\|$, where y is a linear transformation, where A is an RIP matrix, a DFT matrix, or a Gaussian matrix, and where x̃ is the pseudo-access vector. For example, the minimization of the pseudo-access vector may correspond to a minimization of a Manhattan norm of a difference between the downlink data projected onto a hyperspace y and a linear transformation of the pseudo access vector x̃ ($\min\|y-A^*\tilde{x}\|$), where the linear transformation of the pseudo access vector x̃ is based on a RIP matrix A, a DFT matrix A, or a Gaussian matrix A. In some aspects, the compression may correspond to a fronthaul compression. In some aspects, the pseudo-access vector may correspond with a first sub-vector of an access vector further including a second sub-vector. In some aspects, the pseudo-access vector may be mapped to a first portion of the plurality of tones and the second sub-vector may include a second portion of the plurality of tones. In some aspects, the second portion of the plurality of tones may be associated with one or more transmitted indices indicating one or more locations associated with the second portion of the plurality of tones.

At 1106, the RU may transmit, to a UE, the decompressed downlink data. The decompressed downlink data may correspond to the pseudo-access vector. For example, the RU 402 may transmit, to a UE 408, the decompressed downlink data 428. In some aspects, 1106 may be performed by downlink component 1446 in FIG. 14.

Figure 12:
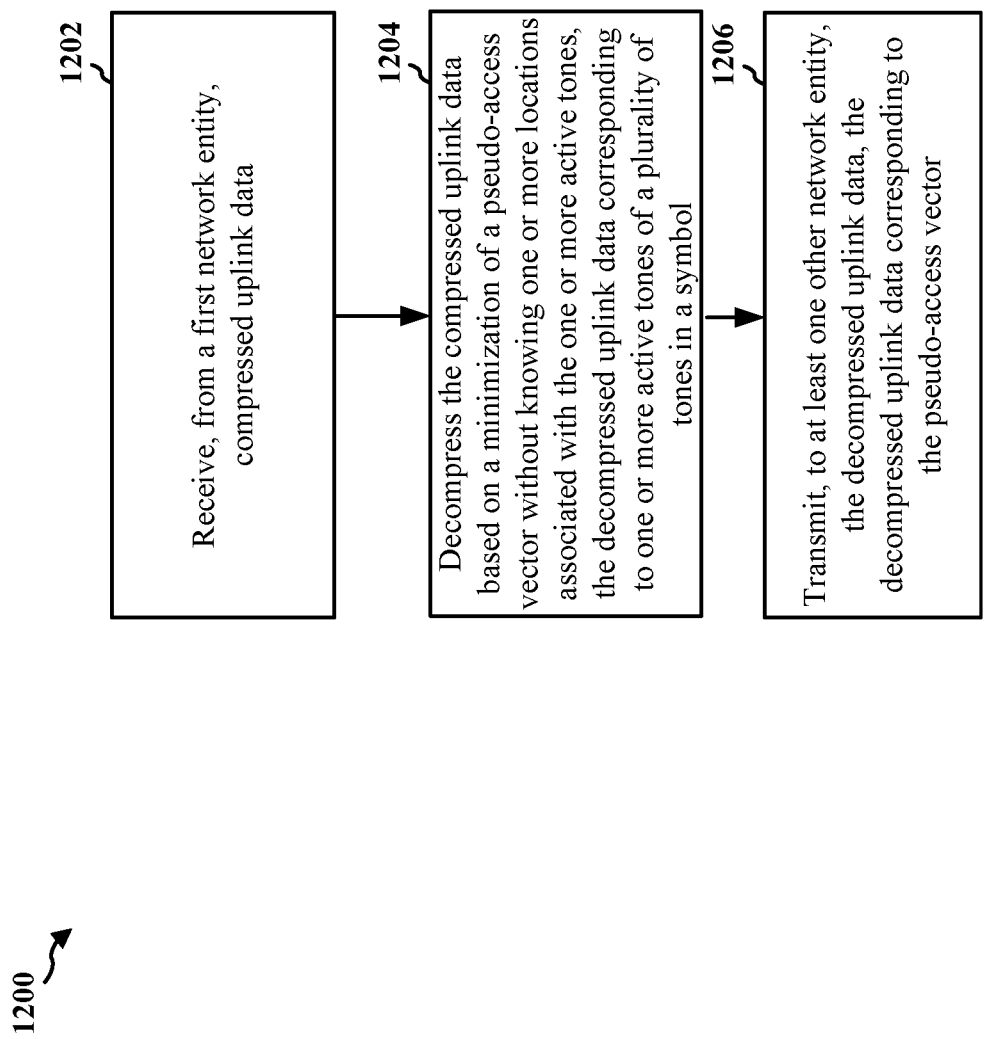
FIG. 12 is a flowchart of a method of wireless communication.

FIG. 12 is a flowchart 1200 of a method of wireless communication. The method may be performed by a base station, such as a DU of a base station (e.g., the base station 102/180, the DU 105, the DU 404, the RAN 406, the apparatus 1402).

At 1202, the DU may receive, from a first network entity, compressed uplink data. For example, the DU 404 may receive, from a first network entity (e.g., the RU 402), compressed uplink data 414. In some aspects, 1202 may be performed by uplink component 1442 in FIG. 14.

At 1204, the DU may decompress the compressed uplink data based on a minimization of a pseudo-access vector without knowing one or more locations associated with one or more active tones of a plurality of tones in a symbol. The decompressed uplink data may correspond to the one or more active tones. For example, the DU 404 may decompress the compressed uplink data based on a minimization of a vector at 416. In some aspects, 1204 may be performed by compression component 1444 in FIG. 14. In some aspects, the minimization of the pseudo-access vector may be a Manhattan norm. In some aspects, the minimization of the pseudo-access vector may correspond to $x_{approx}=\min\|y-A\tilde{x}\|$, where y is a linear transformation, where A is an RIP matrix, a DFT matrix, or a Gaussian matrix, and where x̃ is the pseudo-access vector. For example, the minimization of the pseudo-access vector may correspond to a minimization of a Manhattan norm of a difference between the downlink data projected onto a hyperspace y and a linear transformation of the pseudo access vector x̃ ($\min\|y-A^*\tilde{x}\|$), and the linear transformation of the pseudo access vector x̃ may be based on a RIP matrix A, a DFT matrix A, or a Gaussian matrix A. In some aspects, the compression may correspond to a fronthaul compression. In some aspects, the pseudo-access vector may correspond with a first sub-vector of an access vector further including a second sub-vector. In some aspects, the pseudo-access vector may be mapped to a first portion of the plurality of tones and the second sub-vector may include a second portion of the plurality of tones. In some aspects, the second portion of the plurality of tones may be associated with one or more transmitted indices indicating one or more locations associated with the second portion of the plurality of tones.

At 1206, the DU may transmit, to at least one other network entity, the decompressed uplink data. For example, the DU 404 may transmit, to at least one other network entity, the decompressed uplink data 418. In some aspects, 1202 may be performed by uplink component 1442 in FIG. 14.

Figure 13:
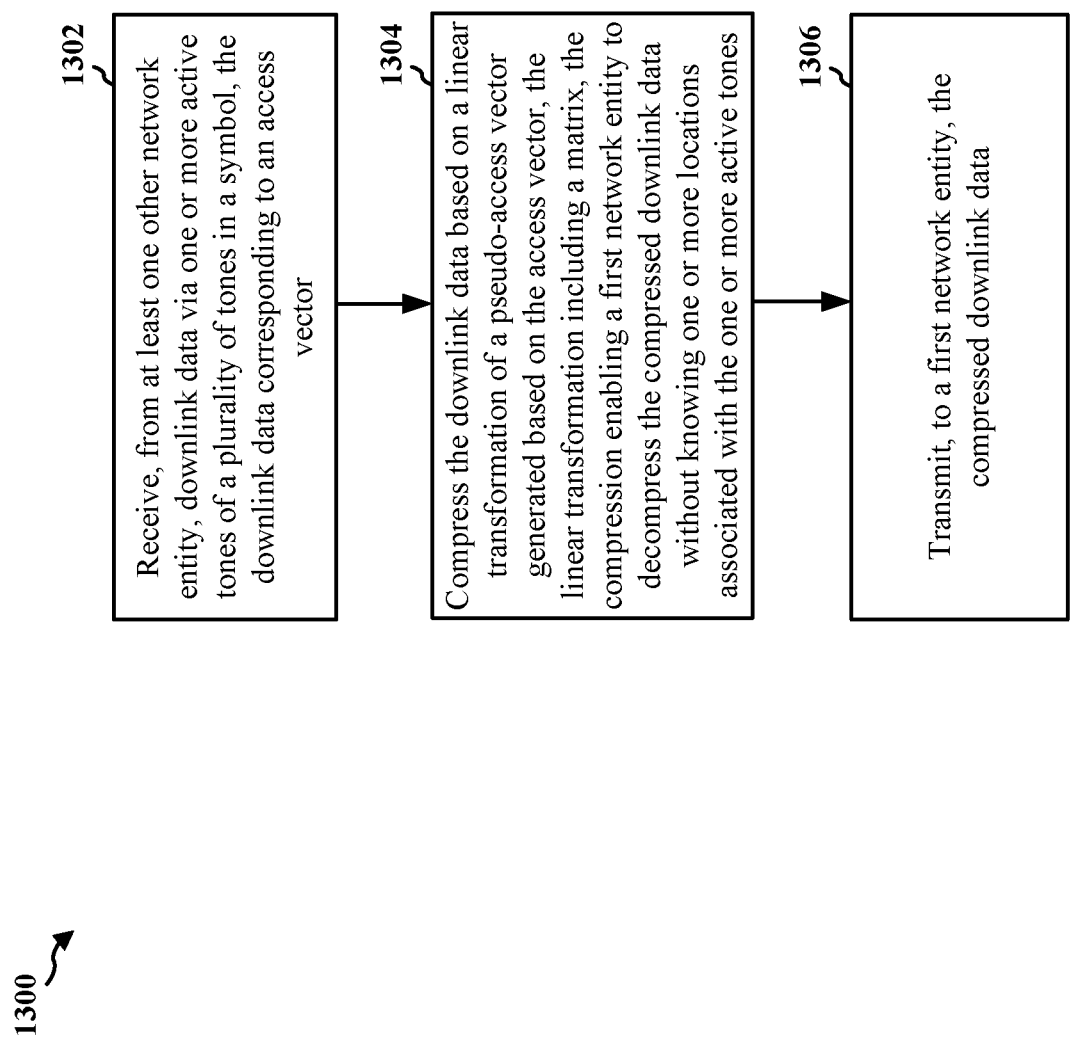
FIG. 13 is a flowchart of a method of wireless communication.

FIG. 13 is a flowchart 1300 of a method of wireless communication. The method may be performed by a base station, such as a DU of a base station (e.g., the base station 102/180, the DU 105, the DU 404, the RAN 406, the apparatus 1402).

At 1302, the DU may receive, from at least one other network entity, downlink data via one or more active tones of a plurality of tones in a symbol. The downlink data may correspond to a vector. For example, the DU 404 may receive, from at least one other network entity, downlink data 420 via one or more active tones of a plurality of tones in a symbol. In some aspects, 1302 may be performed by downlink component 1446 in FIG. 14. In some aspects, the one or more active tones may be equal to M and the plurality of tones may be equal to N, and M<N.

At 1304, the DU may compress the downlink data based on a linear transformation of a pseudo-access vector generated based on the access vector. The linear transformation may include a matrix. For example, the DU 404 may compress the downlink data based on a linear transformation of a pseudo-access vector generated based on the access vector at 422. In some aspects, 1304 may be performed by compression component 1444 in FIG. 14. In some aspects, a size of the matrix may be equal to L*N, and L≥2M. In some aspects, the linear transformation may correspond to y=A*x̃, where A is the matrix and x̃ is the pseudo-access vector. In some aspects, the matrix may be an RIP matrix, a DFT matrix, or a Gaussian matrix. In some aspects, the compression may correspond to a fronthaul compression. In some aspects, the access vector is divided into a first sub-vector and a second sub-vector. The first sub-vector may correspond to the pseudo-access vector mapped to a first portion of the plurality of tones and the second sub-vector may include a second portion of the plurality of tones. In some aspects, the second portion of the plurality of tones may be associated with one or more transmitted indices indicating one or more locations associated with the second portion of the plurality of tones.

At 1306, the DU may transmit, to a first network entity, the compressed downlink data. For example, the DU 404 may transmit, to a first network entity (e.g., the RU 402), the compressed downlink data 424. In some aspects, 1302 may be performed by downlink component 1446 in FIG. 14.

Figure 14:
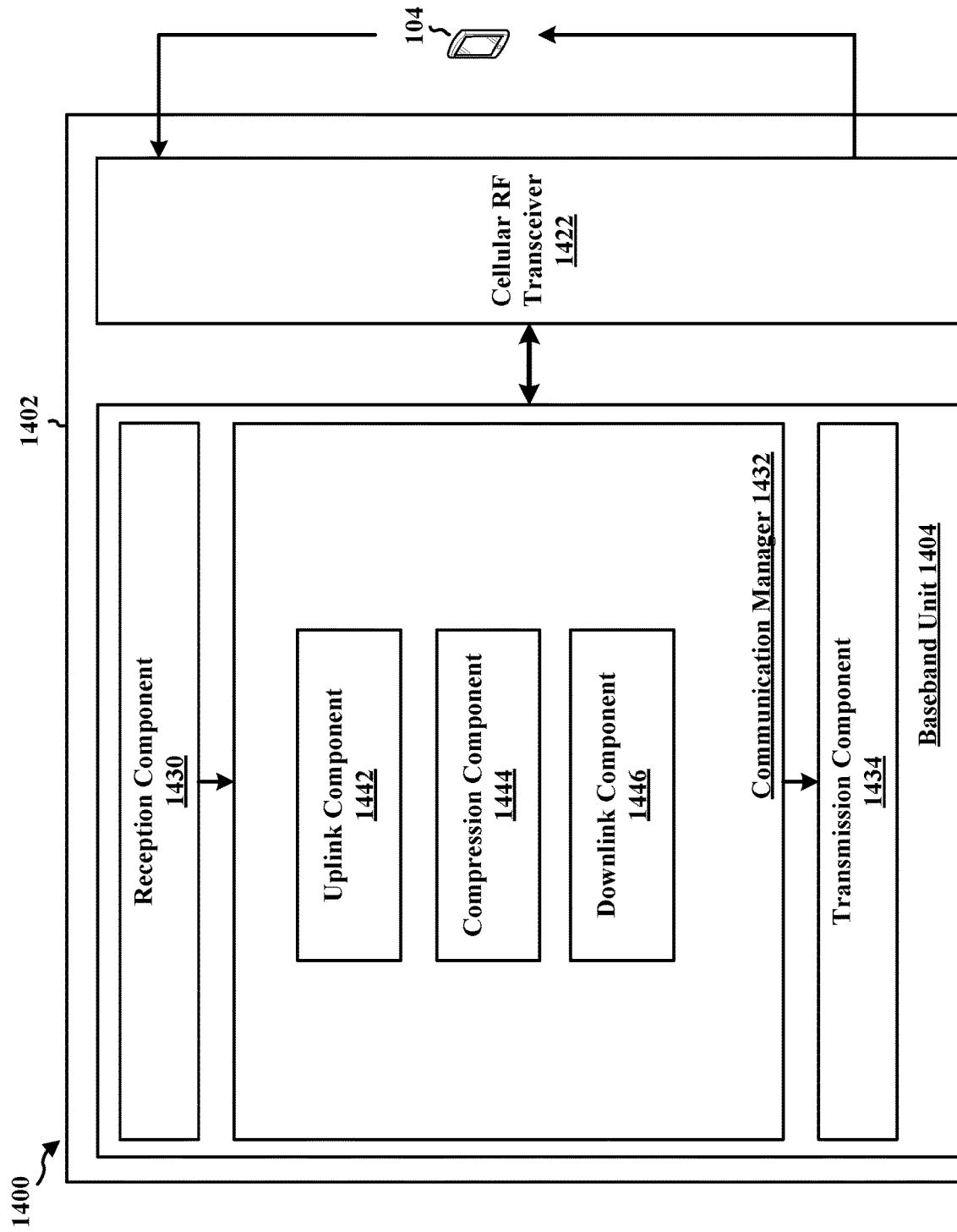
FIG. 14 is a diagram illustrating an example of a hardware implementation for an example apparatus.

FIG. 14 is a diagram 1400 illustrating an example of a hardware implementation for an apparatus 1402. The apparatus 1402 may be a base station, a component of a base station, or may implement base station functionality. In some aspects, the apparatus 1402 may include a baseband unit 1404. The baseband unit 1404 may communicate through a cellular RF transceiver 1422 with the UE 104. The baseband unit 1404 may include a computer-readable medium/memory. The baseband unit 1404 is responsible for general processing, including the execution of software stored on the computer-readable medium/memory. The software, when executed by the baseband unit 1404, causes the baseband unit 1404 to perform the various functions described supra. The computer-readable medium/memory may also be used for storing data that is manipulated by the baseband unit 1404 when executing software. The baseband unit 1404 further includes a reception component 1430, a communication manager 1432, and a transmission component 1434. The communication manager 1432 includes the one or more illustrated components. The components within the communication manager 1432 may be stored in the computer-readable medium/memory and/or configured as hardware within the baseband unit 1404. The baseband unit 1404 may be a component of the base station 310 and may include the memory 376 and/or at least one of the TX processor 316, the RX processor 370, and the controller/processor 375.

The communication manager 1432 may include an uplink component 1442 that may receive, from a UE, uplink data via one or more active tones of a plurality of tones in a symbol, the uplink data corresponding to an access vector, transmit, to the second network entity, the compressed uplink data, receive, from a first network entity, compressed uplink data, or transmit, to at least one other network entity, the decompressed uplink data, e.g., as described in connection with 1002 in FIG. 10, 1006 in FIG. 10, 1202 in FIG. 12, or 1206 in FIG. 12. The communication manager 1432 further may include a compression component 1444 that may compress the uplink or downlink data based on a linear transformation of a pseudo-access vector generated based on the access vector or decompress the compressed uplink or downlink data based on a minimization of a vector, e.g., as described in connection with 1004 in FIG. 10, 1104 in FIG. 11, 1204 in FIG. 12, or 1304 in FIG. 13. The communication manager 1432 further may include a downlink component 1446 that may receive, from a second network entity, compressed downlink data, transmit, to a UE, the decompressed downlink data, the decompressed downlink data corresponding to the pseudo-access vector, receive, from at least one other network entity, downlink data via one or more active tones of a plurality of tones in a symbol, the downlink data corresponding to a vector, or transmit, to a first network entity, the compressed downlink data, e.g., as described in connection with 1102 in FIG. 11, 1106 in FIG. 11, 1302 in FIG. 13, or 1306 in FIG. 13.

The apparatus may include additional components that perform each of the blocks of the algorithm in the flowcharts of FIGS. 10-13. As such, each block in the flowcharts of FIGS. 10-13 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

As shown, the apparatus 1402 may include a variety of components configured for various functions. In one configuration, the apparatus 1402, and in particular the baseband unit 1404, may include means for receiving, from a UE, uplink data via one or more active tones of a plurality of tones in a symbol, the uplink data corresponding to an access vector. The baseband unit 1404 may further include means for compressing the uplink data based on a linear transformation of a pseudo-access vector generated based on the access vector, the linear transformation including a matrix, the compression enabling a second network entity to decompress the compressed uplink data without knowing one or more locations associated with the one or more active tones. The baseband unit 1404 may further include means for transmitting, to the second network entity, the compressed uplink data. The baseband unit 1404 may further include means for receiving, from a second network entity, compressed downlink data. The baseband unit 1404 may further include means for decompressing the compressed downlink data based on a minimization of a pseudo-access vector, the decompressed downlink data corresponding to one or more active tones of a plurality of tones in a symbol. The baseband unit 1404 may further include means for transmitting, to a UE, the decompressed downlink data, the decompressed downlink data corresponding to the pseudo-access vector. The baseband unit 1404 may further include means for receiving, from a first network entity, compressed uplink data. The baseband unit 1404 may further include means for decompressing the compressed uplink data based on a minimization of a pseudo-access vector, the decompressed uplink data corresponding to one or more active tones of a plurality of tones in a symbol. The baseband unit 1404 may further include means for transmitting, to at least one other network entity, the decompressed uplink data. The baseband unit 1404 may further include means for receiving, from at least one other network entity, downlink data via one or more active tones of a plurality of tones in a symbol, the downlink data corresponding to a vector. The baseband unit 1404 may further include means for compressing the downlink data based on a linear transformation of a pseudo-access vector generated based on the access vector, the linear transformation including a matrix, the compression enabling a second network entity to decompress the compressed uplink data without knowing one or more locations associated with the one or more active tones. The baseband unit 1404 may further include means for transmitting, to a first network entity, the compressed downlink data. The means may be one or more of the components of the apparatus 1402 configured to perform the functions recited by the means. As described supra, the apparatus 1402 may include the TX Processor 316, the RX Processor 370, and the controller/processor 375. As such, in one configuration, the means may be the TX Processor 316, the RX Processor 370, and the controller/processor 375 configured to perform the functions recited by the means.

Aspects provided herein may provide a fronthaul compression for sparse access or provide a fronthaul compression for dense access via sparse recovery and support. Utilizing compression methods provided herein, network entities, such as RU or DU at a base station, may compress data with more accuracy.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Terms such as "if," "when," and "while" should be interpreted to mean "under the condition that" rather than imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The following aspects are illustrative only and may be combined with other aspects or teachings described herein, without limitation.

Aspect 1 is an apparatus for wireless communication at a first network entity, comprising: a memory; and at least one processor coupled to the memory and configured to: receive, from a UE, uplink data via one or more active tones of a plurality of tones in a symbol, the uplink data corresponding to an access vector; compress the uplink data based on a linear transformation of a pseudo-access vector generated based on the access vector, the linear transformation including a matrix, the compression enabling a second network entity to decompress the compressed uplink data without knowing one or more locations associated with the one or more active tones; and transmit, to the second network entity, the compressed uplink data.

Aspect 2 is the apparatus of aspect 1, wherein the one or more active tones are equal to M and the plurality of tones is equal to N, and wherein M<N.

Aspect 3 is the apparatus of any of aspects 1-2, wherein a size of the matrix is equal to L*N, where L≥2M.

Aspect 4 is the apparatus of any of aspects 1-3, wherein the linear transformation corresponds to y=A*R, where A is the matrix and x is the pseudo-access vector.

Aspect 5 is the apparatus of any of aspects 1-4, wherein the matrix is a RIP matrix, a DFT matrix, or a Gaussian matrix.

Aspect 6 is the apparatus of any of aspects 1-5, wherein the compression is performed by a RU.

Aspect 7 is the apparatus of any of aspects 1-6, further comprising a transceiver coupled to the at least one processor, wherein the at least one processor is configured to receive the uplink data and transmit the compressed uplink data via the transceiver, and wherein the compression corresponds to a fronthaul compression. Aspect 8 is the apparatus of any of aspects 1-7, wherein the first network entity comprises a RU.

Aspect 9 is the apparatus of any of aspects 1-8, wherein the access vector is divided into a first sub-vector and a second sub-vector, wherein the first sub-vector corresponds to the pseudo-access vector mapped to a first portion of the plurality of tones and the second sub-vector comprises a second portion of the plurality of tones, and wherein the second portion of the plurality of tones is associated with one or more transmitted indices indicating one or more locations associated with the second portion of the plurality of tones.

Aspect 10 is an apparatus for wireless communication at a first network entity, comprising: a memory; and at least one processor coupled to the memory and configured to: receive, from a second network entity, compressed downlink data; decompress the compressed downlink data based on a minimization of a pseudo-access vector without knowing one or more locations associated with one or more active tones of a plurality of tones in a symbol, the decompressed downlink data corresponding to the one or more active tones; and transmit, to a UE, the decompressed downlink data, the decompressed downlink data corresponding to the pseudo-access vector.

Aspect 11 is the apparatus of aspect 10, wherein the minimization of the pseudo-access vector is a Manhattan norm.

Aspect 12 is the apparatus of any of aspects 10-11, wherein the minimization of the pseudo-access vector corresponds to a minimization of a Manhattan norm of a difference between the downlink data projected onto a hyperspace y and a linear transformation of the pseudo access vector $\tilde{x}$ ($\min\|y-A^*\tilde{x}\|$), wherein the linear transformation of the pseudo access vector $\tilde{x}$ is based on a restricted isometric property (RIP) matrix A, a discrete Fourier transform (DFT) matrix A, or a Gaussian matrix A.

Aspect 13 is the apparatus of any of aspects 10-12, wherein the first network entity comprises a RU.

Aspect 14 is the apparatus of any of aspects 10-13, wherein the decompression corresponds to a fronthaul decompression.

Aspect 15 is the apparatus of any of aspects 10-14, wherein the pseudo-access vector correspond with a first sub-vector of an access vector comprising a second sub-vector, wherein the pseudo-access vector is mapped to a first portion of the plurality of tones and the second sub-vector comprises a second portion of the plurality of tones, and wherein the second portion of the plurality of tones is associated with one or more transmitted indices indicating one or more locations associated with the second portion of the plurality of tones.

Aspect 16 is the apparatus of any of aspects 10-15, further comprising a transceiver coupled to the at least one processor, wherein the at least one processor is configured to receive the compressed downlink data and transmit the decompressed downlink data via the transceiver.

Aspect 17 is an apparatus for wireless communication at a second network entity, comprising: a memory; and at least one processor coupled to the memory and configured to: receive, from a first network entity, compressed uplink data; decompress the compressed uplink data based on a minimization of a pseudo-access vector without knowing one or more locations associated with one or more active tones of a plurality of tones in a symbol, the decompressed uplink data corresponding to one or more active tones; and transmit, to at least one other network entity, the decompressed uplink data.

Aspect 18 is the apparatus of aspect 17, wherein the minimization of the pseudo-access vector is a Manhattan norm.

Aspect 19 is the apparatus of any of aspects 17-18, wherein the minimization of the pseudo-access vector corresponds to a minimization of a Manhattan norm of a difference between the uplink data projected onto a hyperspace y and a linear transformation of the pseudo access vector $\tilde{x}$ ($\min\|y-A^*\tilde{x}\|$), wherein the linear transformation of the pseudo access vector $\tilde{x}$ is based on a restricted isometric property (RIP) matrix A, a discrete Fourier transform (DFT) matrix A, or a Gaussian matrix A.

Aspect 20 is the apparatus of any of aspects 17-19, wherein the second network entity comprises a DU.

Aspect 21 is the apparatus of any of aspects 17-20, wherein the access vector is divided into a first sub-vector and a second sub-vector, wherein the first sub-vector corresponds to the pseudo-access vector mapped to a first portion of the plurality of tones and the second sub-vector comprises a second portion of the plurality of tones, and wherein the second portion of the plurality of tones is associated with one or more transmitted indices indicating one or more locations associated with the second portion of the plurality of tones.

Aspect 22 is the apparatus of any of aspects 17-21, further comprising a transceiver coupled to the at least one processor, wherein the at least one processor is configured to receive the compressed uplink data and transmit the decompressed uplink data via the transceiver.

Aspect 23 is an apparatus for wireless communication at a second network entity, comprising: a memory; and at least one processor coupled to the memory and configured to: receive, from at least one other network entity, downlink data via one or more active tones of a plurality of tones in a symbol, the downlink data corresponding to a vector; compress the downlink data based on a linear transformation of a pseudo-access vector generated based on the access vector, the linear transformation including a matrix, the compression enabling a first network entity to decompress the compressed uplink data without knowing one or more locations associated with the one or more active tones; and transmit, to the first network entity, the compressed downlink data.

Aspect 24 is the apparatus of aspect 23, wherein the one or more active tones are equal to M and the plurality of tones is equal to N, and wherein M<N.

Aspect 25 is the apparatus of any of aspects 23-24, wherein a size of the matrix is equal to L*N, where L≥2M.

Aspect 26 is the apparatus of any of aspects 23-25, wherein the linear transformation corresponds to $y=A^*\tilde{x}$, where A is the matrix and $\tilde{x}$ is the pseudo-access vector.

Aspect 27 is the apparatus of any of aspects 23-26, wherein the matrix is a RIP matrix, a DFT matrix, or a Gaussian matrix.

Aspect 28 is the apparatus of any of aspects 23-27, further comprising a transceiver coupled to the at least one processor, wherein the at least one processor is configured to receive the downlink data and transmit the compressed downlink data via the transceiver.

Aspect 29 is the apparatus of any of aspects 23-28, wherein the second network entity comprises a DU.

Aspect 30 is the apparatus of any of aspects 23-29, wherein the access vector is divided into a first sub-vector and a second sub-vector, wherein the first sub-vector corresponds to the pseudo-access vector mapped to a first portion of the plurality of tones and the second sub-vector comprises a second portion of the plurality of tones, and wherein the second portion of the plurality of tones is associated with one or more transmitted indices indicating one or more locations associated with the second portion of the plurality of tones.

Aspect 31 is a method of wireless communication for implementing any of aspects 1 to 9.

Aspect 32 is an apparatus for wireless communication including means for implementing any of aspects 1 to 9.

Aspect 33 is a computer-readable medium storing computer executable code, where the code when executed by a processor causes the processor to implement any of aspects 1 to 9.

Aspect 34 is a method of wireless communication for implementing any of aspects 10 to 16.

Aspect 35 is an apparatus for wireless communication including means for implementing any of aspects 10 to 16.

Aspect 36 is a computer-readable medium storing computer executable code, where the code when executed by a processor causes the processor to implement any of aspects 10 to 16.

Aspect 37 is a method of wireless communication for implementing any of aspects 17 to 22.

Aspect 38 is an apparatus for wireless communication including means for implementing any of aspects 17 to 22.

Aspect 39 is a computer-readable medium storing computer executable code, where the code when executed by a processor causes the processor to implement any of aspects 17 to 22.

Aspect 40 is a method of wireless communication for implementing any of aspects 23 to 30.

Aspect 41 is an apparatus for wireless communication including means for implementing any of aspects 23 to 30.

Aspect 42 is a computer-readable medium storing computer executable code, where the code when executed by a processor causes the processor to implement any of aspects 23 to 30.

What is claimed is:

1. An apparatus for wireless communication at a first network entity, comprising:
a memory; and
at least one processor coupled to the memory and configured to:
receive, from a user equipment (UE), uplink data via one or more active tones of a plurality of tones in a symbol, the uplink data corresponding to an access vector;
compress the uplink data based on a linear transformation of a pseudo-access vector generated based on the access vector, the linear transformation including a matrix, the compression enabling a second network entity to decompress the compressed uplink data without knowing one or more locations associated with the one or more active tones; and
transmit, to the second network entity, the compressed uplink data.

2. The apparatus of claim 1, wherein the one or more active tones are equal to M and the plurality of tones is equal to N, wherein M<N, and wherein M and N are values greater than one.

3. The apparatus of claim 2, wherein a size of the matrix is equal to L*N, where L≥2M.

4. The apparatus of claim 1, wherein the linear transformation corresponds to y=A*x̃, where A is the matrix and x̃ is the pseudo-access vector.

5. The apparatus of claim 1, wherein the matrix is a restricted isometric property (RIP) matrix, a discrete Fourier transform (DFT) matrix, or a Gaussian matrix.

6. The apparatus of claim 1, wherein the compression is performed by a radio unit (RU).

7. The apparatus of claim 1, further comprising a transceiver coupled to the at least one processor, wherein the at least one processor is configured to receive the uplink data and transmit the compressed uplink data via the transceiver, and wherein the compression corresponds to a fronthaul compression.

8. The apparatus of claim 1, wherein the first network entity comprises a radio unit (RU).

9. The apparatus of claim 1, wherein the access vector is divided into a first sub-vector and a second sub-vector, wherein the first sub-vector corresponds to the pseudo-access vector mapped to a first portion of the plurality of tones and the second sub-vector comprises a second portion of the plurality of tones, and wherein the second portion of the plurality of tones is associated with one or more transmitted indices indicating one or more locations associated with the second portion of the plurality of tones.

10. An apparatus for wireless communication at a first network entity, comprising:
a memory; and
at least one processor coupled to the memory and configured to:
receive, from a second network entity, compressed downlink data;
decompress the compressed downlink data based on a minimization of a pseudo-access vector without knowing one or more locations associated with one or more active tones of a plurality of tones in a symbol, the decompressed downlink data corresponding to the one or more active tones; and
transmit, to a user equipment (UE), the decompressed downlink data, the decompressed downlink data corresponding to the pseudo-access vector.

11. The apparatus of claim 10, wherein the minimization of the pseudo-access vector is a Manhattan norm.

12. The apparatus of claim 10, wherein the minimization of the pseudo-access vector corresponds to a minimization of a Manhattan norm of a difference between the downlink data projected onto a hyperspace y and a linear transformation of the pseudo-access vector x̃ ($\min\|y-A*\tilde{x}\|$), wherein the linear transformation of the pseudo-access vector x̃ is based on a restricted isometric property (RIP) matrix A, a discrete Fourier transform (DFT) matrix A, or a Gaussian matrix A.

13. The apparatus of claim 10, wherein the decompression is performed by a radio unit (RU).

14. The apparatus of claim 10, wherein the decompression corresponds to a fronthaul decompression.

15. The apparatus of claim 10, wherein the pseudo-access vector corresponds with a first sub-vector of an access vector comprising a second sub-vector, wherein the pseudo-access vector is mapped to a first portion of the plurality of tones and the second sub-vector comprises a second portion of the plurality of tones, and wherein the second portion of the plurality of tones is associated with one or more transmitted indices indicating one or more locations associated with the second portion of the plurality of tones.

16. The apparatus of claim 10, further comprising a transceiver coupled to the at least one processor, wherein the at least one processor is configured to receive the compressed downlink data and transmit the decompressed downlink data via the transceiver.

17. An apparatus for wireless communication at a first network entity, comprising:
a memory; and
at least one processor coupled to the memory and configured to:
receive, from a second network entity, compressed uplink data;
decompress the compressed uplink data based on a minimization of a pseudo-access vector without knowing one or more locations associated with one or more active tones active tones of a plurality of tones in a symbol, the decompressed uplink data corresponding to the one or more active tones; and
transmit, to at least one other network entity, the decompressed uplink data, the decompressed uplink data corresponding to the pseudo-access vector.

18. The apparatus of claim 17, wherein the minimization of the pseudo-access vector is a Manhattan norm.

19. The apparatus of claim 17, wherein the minimization of the pseudo-access vector corresponds to a minimization of a Manhattan norm of a difference between the uplink data projected onto a hyperspace y and a linear transformation of the pseudo-access vector $\tilde{x}$ ($\min\|y-A*\tilde{x}\|$), wherein the linear transformation of the pseudo-access vector $\tilde{x}$ is based on a restricted isometric property (RIP) matrix A, a discrete Fourier transform (DFT) matrix A, or a Gaussian matrix A.

20. The apparatus of claim 17, wherein the first network entity comprises a distributed unit (DU).

21. The apparatus of claim 17, wherein the pseudo-access vector corresponds with a first sub-vector of an access vector comprising a second sub-vector, wherein the pseudo-access vector is mapped to a first portion of the plurality of tones and the second sub-vector comprises a second portion of the plurality of tones, and wherein the second portion of the plurality of tones is associated with one or more transmitted indices indicating one or more locations associated with the second portion of the plurality of tones.

22. The apparatus of claim 17, further comprising a transceiver coupled to the at least one processor, wherein the at least one processor is configured to receive the compressed uplink data and transmit the decompressed uplink data via the transceiver.

23. An apparatus for wireless communication at a first network entity, comprising:
a memory; and
at least one processor coupled to the memory and configured to:
receive, from at least one other network entity, downlink data via one or more active tones of a plurality of tones in a symbol, the downlink data corresponding to an access vector;
compress the downlink data based on a linear transformation of a pseudo-access vector generated based on the access vector, the linear transformation including a matrix, the compression enabling a second network entity to decompress the compressed downlink data without knowing one or more locations associated with the one or more active tones; and
transmit, to the second network entity, the compressed downlink data.

24. The apparatus of claim 23, wherein the one or more active tones are equal to M and the plurality of tones is equal to N, wherein M<N, and wherein M and N are values greater than one.

25. The apparatus of claim 24, wherein a size of the matrix is equal to L*N, where L≥2M.

26. The apparatus of claim 23, wherein the linear transformation corresponds to $y=A*\tilde{x}$, where A is the matrix and X is the pseudo-access vector.

27. The apparatus of claim 23, wherein the matrix is a restricted isometric property (RIP) matrix, a discrete Fourier transform (DFT) matrix, or a Gaussian matrix.

28. The apparatus of claim 23, further comprising a transceiver coupled to the at least one processor, wherein the at least one processor is configured to receive the downlink data and transmit the compressed downlink data via the transceiver, and wherein the first network entity comprises a distributed unit (DU).

29. The apparatus of claim 23, wherein the first network entity comprises a distributed unit (DU).

30. The apparatus of claim 23, wherein the access vector is divided into a first sub-vector and a second sub-vector, wherein the first sub-vector corresponds to the pseudo-access vector mapped to a first portion of the plurality of tones and the second sub-vector comprises a second portion of the plurality of tones, and wherein the second portion of the plurality of tones is associated with one or more transmitted indices indicating one or more locations associated with the second portion of the plurality of tones.

* * * * *